US006535785B2

United States Patent

(12) United States Patent
Johnson et al.
(10) Patent No.: US 6,535,785 B2
(45) Date of Patent: *Mar. 18, 2003

(54) SYSTEM AND METHOD FOR MONITORING AND CONTROLLING GAS PLASMA PROCESSES

(75) Inventors: Wayne Johnson, Phoenix, AZ (US); Richard Parsons, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/984,760

(22) Filed: Oct. 31, 2001

(65) Prior Publication Data

US 2002/0026251 A1 Feb. 28, 2002

Related U.S. Application Data

(63) Continuation of application No. 09/508,105, filed as application No. PCT/US98/18498 on Sep. 17, 1998, now Pat. No. 6,351,683.

(60) Provisional application No. 60/059,151, filed on Sep. 17, 1997, provisional application No. 60/059,173, filed on Sep. 17, 1997, and provisional application No. 60/059,176, filed on Sep. 17, 1997.

(51) Int. Cl.[7] .................................... G06F 19/00

(52) U.S. Cl. ....................... 700/121; 700/117; 700/118; 700/108; 438/8; 438/9; 438/17; 156/345; 156/346; 156/348; 324/622; 324/623; 324/647

(58) Field of Search ................................ 700/121, 116, 700/117, 108, 110; 438/8, 9, 10, 11, 17, 711; 156/345, 346, 347, 348, 627.1; 354/622, 623, 647, 637, 638, 704

(56) References Cited

U.S. PATENT DOCUMENTS 4,043,889 A 8/1977 Kochel .................. 209/192.13

4,116,783 A 9/1978 Generini ..................... 588/273

(List continued on next page.)

OTHER PUBLICATIONS

Logan et al., "Electrical Characterization of Radio–Frequency Sputtering Gas Discharge", J.Vac. Sci Technol., 6, p. 120 (1968).

Godyak, "Electrical Characteristics of Parallel–Plate RF Discharges in Argon," IEEE Transactions on Plasma Sci., 19(4), p. 660 (1991).

Sobolewski, "Electrical Characterization of Radio–Frequency Discharges in the Gaseous . . . ", J. Vac. Sci. Technol., 10(6) (1992).

Maynard et al., "Plasma Etching Endpointing by Monitoring RF Power Systems With an Artificial Neural Network," Electrochem. Soc. Proc., 95–4, p. 189–207, 1995.

Maynard et al., "Plasma Etching Endpointing by Monitoring Radio–Frequency Power Systems with an Artificial Neural Network", J. Electrochem. Soc., 143(6).

*Primary Examiner*—Ramesh Patel

(74) *Attorney, Agent, or Firm*—Oblon, Spivak, McClelland, Maier & Neustadt, P.C.

(57) ABSTRACT

A system and method for monitoring the conditions in a gas plasma processing system while varying or modulating the RF power supplied to the system, so that resulting signals of the electrical circuits of the system provide information regarding operational parameters of the system or the state of a process. Significant improvements in sensitivity and accuracy over conventional techniques are thereby achieved. In addition, the plasma processing system can be thoroughly tested and characterized before delivery, to allow more accurate monitoring of and greater control over a process, thereby improving quality control/assurance of substrates being produced by the system. The information obtained by the modulation technique can be displayed on a monitor screen, in order to allow an operator to accurately monitor the system/process and diagnose any problems with the system/process.

18 Claims, 17 Drawing Sheets

U.S. PATENT DOCUMENTS 4,207,137 A 6/1980 Tretola ........................ 438/10
5,025,135 A 6/1991 Gesche et al. .............. 219/506
5,160,402 A 11/1992 Cheng ......................... 216/59
5,195,045 A 3/1993 Keane et al. ............... 702/107
5,325,019 A 6/1994 Miller et al. ............ 315/111.21
5,347,460 A * 9/1994 Gifford et al. ......... 204/192.33
5,472,561 A * 12/1995 Williams et al. .............. 216/61
5,474,648 A * 12/1995 Patrick et al. ......... 156/345.28
5,479,340 A 12/1995 Fox et al. ..................... 700/33
5,523,955 A * 6/1996 Heckman ............... 315/111.31
5,535,906 A * 7/1996 Drummond ............ 156/345.44
5,543,689 A 8/1996 Ohta et al. .............. 315/111.21
5,556,501 A * 9/1996 Collins et al. ......... 156/345.38
5,556,549 A 9/1996 Patrick et al. .............. 156/627
5,571,366 A 11/1996 Ishii et al. .................. 156/345
5,573,595 A * 11/1996 Dible ..................... 118/723 E
5,576,629 A 11/1996 Turner et al. ............... 324/709
5,621,331 A 4/1997 Smith et al. ................ 324/645
5,629,653 A * 5/1997 Stimson ..................... 333/17.3
5,658,423 A * 8/1997 Angell et al. .......... 204/192.13
5,824,606 A * 10/1998 Dible et al. ............ 156/345.28
6,332,961 B1 * 12/2001 Johnson et al. ............. 118/663
6,351,683 B1 * 2/2002 Johnson et al. ............. 156/346

* cited by examiner

GAS INLETS 123
CHAMBER 33
COIL 30
BIAS SHIELD 32
WAFER 40
CHUCK 31
GAS FLOW
PROCESSING EQUIPMENT FOR OTHER PROCESSES 100
CENTRAL PROCESS CONTROLLER 20
PHASE/AMPLITUDE DETETOR 11
PHASE/AMPLITUDE DETECTOR 12
PHASE/AMPLITUDE DETECTOR 13
MONITOR/ CONTROLLER 1
M1
M2
M3
LO
RF
IF
MODULATION SIGNAL GENERATOR 3
RF SOURCE 2A
RF SOURCE 2B
RF SOURCE 2C

HARMONIC RATIOS: AMPLITUDE

| NUMERATOR / DENOMINATOR | $f_F$ | $f_2$ | $f_3$ | $f_4$ | $f_5$ | $f_6$ |
|---|---|---|---|---|---|---|
| $f_F$ | 1.00 | 0.54 | 0.47 | 0.31 | 0.23 | 0.15 |
| $f_2$ | 1.85 | 1.00 | ... | ... | ... | ... |
| $f_3$ | 2.13 | ... | 1.00 | ... | ... | ... |
| $f_4$ | 3.22 | ... | ... | 1.00 | ... | ... |
| $f_5$ | 4.35 | ... | ... | ... | 1.00 | ... |
| $f_6$ | 6.67 | ... | ... | ... | ... | 1.00 |
| $f_7$ | 9.02 | ... | ... | ... | ... | ... |

$$|V_{IN}| = \sqrt{V_{OI}^2 + V_{OQ}^2}$$

$$\emptyset = \tan^{-1}\left(V_{OQ}/V_{OI}\right)$$

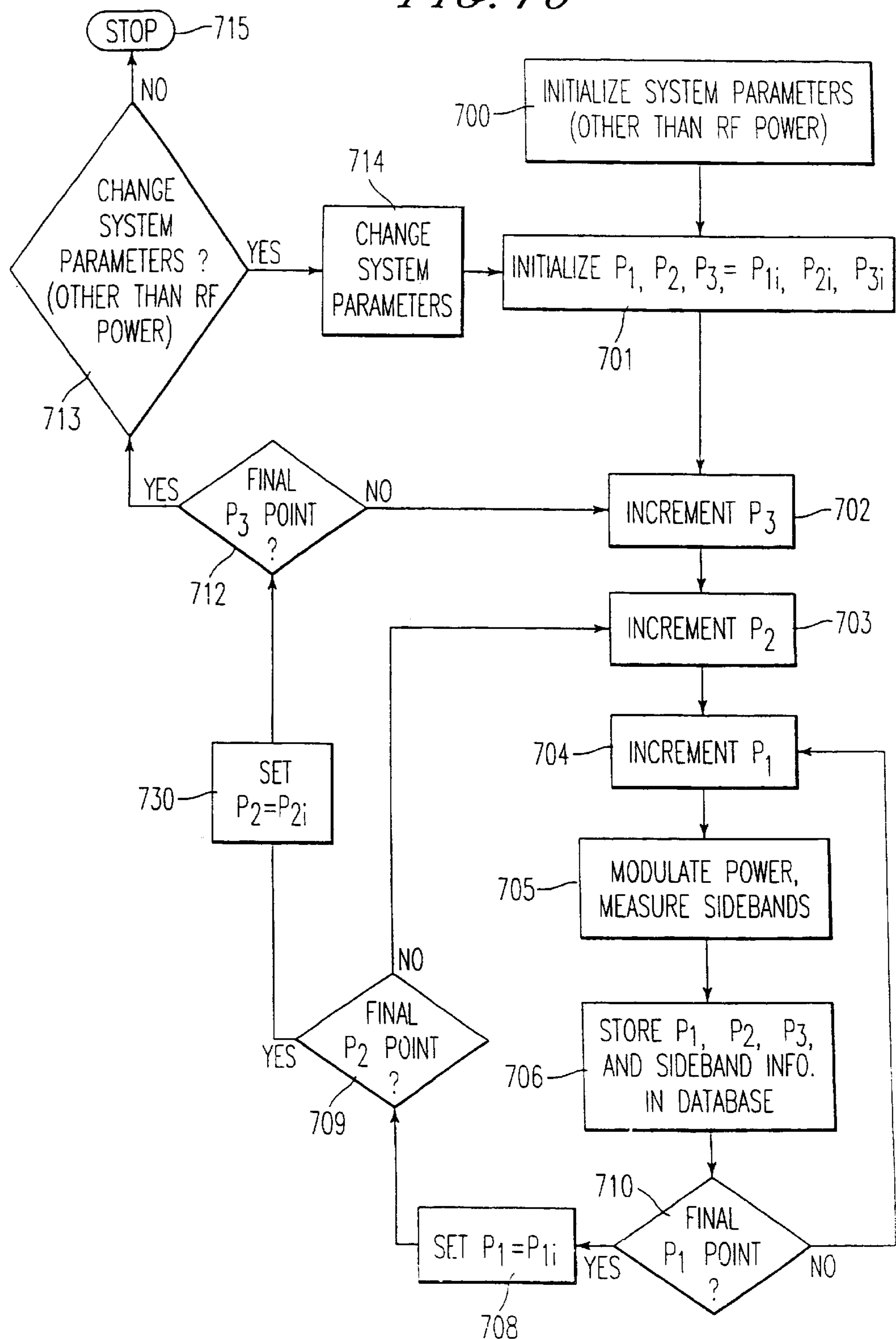

FIG. 10
STOP
715
NO
CHANGE SYSTEM PARAMETERS ? (OTHER THAN RF POWER)
713
YES
714
CHANGE SYSTEM PARAMETERS
700
INITIALIZE SYSTEM PARAMETERS (OTHER THAN RF POWER)
INITIALIZE $P_1$, $P_2$, $P_3$,= $P_{1i}$, $P_{2i}$, $P_{3i}$
701
YES
FINAL $P_3$ POINT ?
NO
712
INCREMENT $P_3$
702
INCREMENT $P_2$
703
704
INCREMENT $P_1$
730
SET $P_2$=$P_{2i}$
705
MODULATE POWER, MEASURE SIDEBANDS
NO
YES
FINAL $P_2$ POINT ?
709
706
STORE $P_1$, $P_2$, $P_3$, AND SIDEBAND INFO. IN DATABASE
710
FINAL $P_1$ POINT ?
SET $P_1$ =$P_{1i}$
YES
NO
708

SYSTEM AND METHOD FOR MONITORING AND CONTROLLING GAS PLASMA PROCESSES

CROSS-REFERENCE TO OTHER CO-PENDING APPLICATIONS

This non-provisional application is a continuation of application Ser. No. 09/508,105, filed Apr. 19, 2000, now U.S. Pat. No. 6,351,683, under 35 USC 120, to PCT Application No. PCT/US98/18498, filed Sep. 17, 1998, under 35 USC 365, and to provisional Application Serial No. 60/059,151, filed Sep. 17, 1997 under 35 USC 119(e), the contents of each of which are incorporated herein by reference. This application is related to "Device and Method for Detecting and Preventing Arcing in RF Plasma Systems," Serial No. 60/059,173, and "Electrical Impedance Matching System and Method," Serial No. 60/059,176. Both applications filed Sep. 17, 1997 are incorporated herein by reference. This application is also related to "Device and Method for Detecting and Preventing Arcing in RF Plasma Systems," Ser. No. 09/508,102, now U.S. Pat. No. 6,332,961, and "Electrical Impedance Matching System and Method," Ser. No. 09/508,103, now U.S. Pat. No. 6,351,683, filed on even date herewith. Both of those non-provisional applications are incorporated by reference.

BACKGROUND OF THE INVENTION

1. Field of the Invention

The invention relates to systems and processes which use electrically generated gas plasma. The invention is particularly applicable to systems and processes which utilize a plasma in manufacturing solid state and/or semiconductor devices.

2. Discussion of the Background

Many semiconductor or solid state manufacturing processes utilize a gas plasma to perform a fabrication step. This step can be, for example, a chemical modification or an etching of a thin film, and may use chlorine gas or oxygen, among others. Often, particularly in the semiconductor industry, extremely precise control of the reaction conditions and the timing of the reaction is required. It is therefore important to accurately monitor the plasma conditions, the condition of the equipment, and the progress of the reaction.

Conventional plasma reaction systems have used optical spectrometry of the optical light emissions from the plasma in order to detect various chemical species produced by the reaction between the substrate and the plasma. Concentrations of these species can be used as an indication of the plasma conditions, or as an indication of the progress of the process being performed with the plasma (e.g., to determine the end point of the process). However, this technique is not sufficiently precise for certain processes. In particular, the optical detection method does not always provide a sufficiently reliable and timely indication of when a processing step (such as the etching of a photoresist or a metal layer) is complete.

Conventional plasma processes systems have also used timing to determine the end of a step. Several test runs are performed under the conditions to be utilized in an actual manufacturing run, in order to determine the reaction rate. During the actual manufacturing run, the plasma processing step is performed for a predetermined amount of time, and then terminated. However, slight variations in, e.g., the ambient environment, the manufacturing equipment, the plasma, and the workpiece can vary the reaction rates/times, thus making this method less than optimal.

Particularly where the processing step requires only a short amount of time, accurate determination of the end point can be crucial. For example, during etching of an extremely thin layer, a delay in the termination of the step can result in the plasma etching into the layer beneath the layer for which etching is intended. As semiconductor processes require increasingly thinner films, and as high density plasma systems allow for shorter etching and reaction times, it has become increasingly important to accurately determine the time at which a processing step is complete.

In addition, integration densities of semiconductor devices have continued to increase, demanding new levels of precision in controlling the reactive processes used for producing the devices. During a processing step, it is increasingly important to carefully control/monitor the conditions of the plasma (e.g., ion density and gas mixture), which directly impact not only rates of reaction, but also thin film material properties. System conditions, such as the cleanliness of the system, proper assembly/configuration of electrical/RF connections, RF matching, age of components, etc., can also affect the plasma conditions. Accordingly, a system and method are needed for accurately monitoring and controlling plasma and system conditions during a given process step, and for detecting the completion of the process step in order to shut down the plasma process at an appropriate time.

Known references have discussed using the harmonic content of an electrical signal to determine the condition of the plasma by exploiting the inherent non-linearity of the plasma. See Miller & Kamon (U.S. Pat. No. 5,325,019 (hereinafter "the '019 patent")), Gesche & Vey (U.S. Pat. No. 5,025,135 (hereinafter "the '135 patent")), Patrick et at. (U.S. Pat. No. 5,474,648 (hereinafter "the '648 patent")), Turner et al. (U.S. Pat. No. 5,576,629 (hereinafter "the '629 patent")), and Williams & Spain (U.S. Pat. No. 5,472,561 (hereinafter "the '561 patent")).

The '135 patent discloses a high-pass filter of a sampled electrical signal wherein the presence of high frequency content determines the existence of a plasma. The '019 patent uses the fundamental and harmonic frequency components of voltage and current measurements (measured at an electrode within the plasma electrical system) to select operating conditions. However, it does not teach correlating harmonic content with plasma process input parameters, such as pressure, RF input, etc. Furthermore, it does not teach control functions based upon the linear and/or non-linear combination of harmonic amplitude ratios (ratio to the amplitude of the fundamental frequency). Likewise, none of the '019, '629, and '561 patents recognize that information regarding a plasma process can be obtained by modulating the RF power.

Several patents address some aspects of intelligent control of plasma processes. In particular, some patents attempt to characterize the plasma system performance, generate a database, monitor electrical components during run conditions, and compare to the database to determine the plasma conditions. For example, Kochel (U.S. Pat. No. 4,043,889) addresses this issue. It discloses a method of using a pre-determined bias voltage versus pressure characteristic to tune a process to 'optimal' conditions (in a chamber performing RF sputtering of a thin film). Moreover, Tretola (U.S. Pat. No. 4,207,137), describes controlling a plasma process.

Additionally, several patents teach monitoring the electrical properties of a plasma system and correlating their variation with plasma conditions. For example, Patrick et al. (U.S. Pat. No. 5,474,648) discloses (a) a control method to improve repeatability and uniformity of process and (b) monitoring the power, voltage, current, phase, impedance, harmonic content and direct current bias of the RF energy transferred to the plasma. Additional references describing electrical property characterization for plasma processing devices include Logan, Mazza & Davidse, “Electrical characterization of radio-frequency sputtering gas discharge,” J. Vac. Sci Technol., 6, p. 120 (1968); Godyak, “Electrical characteristics of parrallel-plate RF discharges in Argon,” IEEE Transactions on Plasma Sci., 19(4), p. 660(1991); and Sobolewski, “Electrical characterization of radio-frequency discharges in the Gaseous . . . ”, J. Vac. Sci. Technol., 10(6) (1992). For real-time control of etching processes using multi-variate statistical analysis, see Fox & Kappuswamy (U.S. Pat. No. 5,479,340).

Some patents also discuss monitoring the optical properties of a plasma. Using an optical emission spectrometer, information about the species present within the plasma (and their approximate concentration) can be ascertained from monitoring the emission spectrum of the light present. In fact, several spectrometers (or those which comprise a rotary grating) may monitor the presence of several species and, hence, provide a plurality of inputs to a plasma process control system. See Cheng (U.S. Pat. No. 5,160,402) and Khoury, Real-time etch plasma monitor system, IBM Technical Disclosure Bull., 25(11A) (1983).

Turner (U.S. Pat. No. 4,166,783) proposes a computer control system for use with deposition rate regulation in a sputtering chamber. The system records the use of the sputtering device and compiles a history of its performance. During future use of the device, the past performance, age, etc., are incorporated into adjustments made during a run condition.

Automatic impedance matching systems are also known which employ a (quasi-)intelligent controller to monitor an electrical property of the plasma chamber. In fact, some systems attempt to obtain some correlation between settings for variable reactances (i.e., capacitors and inductors) and plasma conditions such as the load impedance or plasma chamber input parameters (i.e., RF input power, chamber pressure, etc.). If correlation is obtained, then coarse tuning of the impedance matching also can be obtained. For example, U.S. Pat. No. 5,195,045 to Keane & Hauer presents a method of using predetermined set points for two impedance varying devices in order to solve tuning problems during run conditions. Additionally, U.S. Pat. No. 5,543,689, to Ohta & Sekizawa, proposes storing match circuit settings from prior use. U.S. Pat. No. 5,621,331, to Smith et al., presents a method for rapidly adjusting the impedance of a variable impedance device to match (a) the impedance of a source to (b) the impedance of a load in a plasma processing device. The device includes a plurality of electrical sensors, a photosensitive detector, a data processor, and a memory. The ’331 patent correlates (1) variable reactance settings and (2) measurements of chemical species present within the plasma using an optical emission spectrometer and electrical measurements taken on plasma coupling elements. In this manner, a set of chemistry conditions may be selected and tuned by monitoring the variable reactance settings.

Neural networks have been used for both predication and control in many areas. A use of neural networks in semiconductor processing to predict the endpoint of an etch process is discussed by Maynard et al. in “Plasma etching endpointing by monitoring RF power systems with an artificial neural network,” Electrochem. Soc. Proc., 95-4, p189–207, 1995, and “Plasma etching endpointing by monitoring radio-frequency power systems with an artificial neural network,” J. Electrochem. Soc., 143(6).

SUMMARY OF THE INVENTION

In view of the foregoing, it is an object of the invention to provide a system and method which can quickly and accurately monitor and control a process that uses a gas plasma, e.g., in a processing system which generates a plasma using radio-frequency (RF) power.

According to one aspect of the invention, the plasma conditions and system conditions are sensed by varying or modulating one or more of the amplitude, phase, and frequency of RF power on an element in the system, and by observing characteristics of the resulting response signals of the same element, and/or one or more other elements in the system. The “elements” are electrical components of the system, more particularly plasma coupling elements such as electrodes, a bias shield, an inductive coil or an electrostatic chuck. The electrical components can also include a probe or another sensor utilized to obtain signals in response to modulation of the power.

In one exemplary embodiment, each of the modulated signals is observed at a node of a power delivery circuit, which can include, for example, an electrical matching network. The measured response information is then compared with stored data obtained for known conditions, and the system conditions are determined as corresponding to the conditions under which the stored data (which most closely resembles the measured data) was obtained.

In a presently preferred embodiment, in order to meaningfully utilize information obtained by modulating the power to one or more of the system components, the processing system is characterized with a series of test runs. The term “test run” is used herein to mean a test of a processing system performed for the purpose of characterizing the system. The test run can be performed under conditions similar to those under which a production run would be performed. In addition, the test run can correspond to conditions to be utilized in performing a diagnostic test of equipment to be utilized in a processing run, so that information obtained in the test run can be utilized to determine the condition of equipment, for example, before a process step commences. A test run is performed by operating the system under a given/known set of plasma conditions and system conditions, applying modulated RF power to one or more of the electrical components (more particularly the plasma coupling elements), and measuring the resulting modulation response signals. A series of test runs are performed by systematically varying the plasma conditions and/or system conditions so that response signals are obtained and correlated with the various conditions, thereby providing response signal data which can be stored as characteristic of the known conditions. For example, the power, pressure, gas mixture, or material being processed can be varied, and the effects of these variations on the modulation response signals can be determined empirically. Additional conditions varied during a test/characterizing run can include cleanliness (time or cycles since cleaning/maintenance was performed), age of components, ambient temperature and/or humidity, etc. It is to be understood that the number of condition variables for which data is obtained can vary depending upon, e.g., the extent to which the profiles will be utilized throughout a processing run, level of sophistication/control desired, and budgetary constraints.

For example, a relatively simple system might utilize modulation response information only to detect the end point of a process, or to indicate the cleanliness of a system. A more complex system can consider additional conditions/variables throughout a process.

The response information obtained during a test run forms a database, which includes a multi-dimensional array of data points, each data point containing information regarding a characteristic, such as the amplitude or phase, of one modulated signal component. For a given set of plasma and system conditions, the data points can be grouped together to form a modulation profile. The term "modulation profile" is used herein to mean a set of data associated with a set of process/system conditions, which represents the characteristics of the signals caused by modulating the RF power to one or more plasma coupling elements. Each set of process conditions stored in the database is thereby associated with (i.e., linked to) a modulation profile.

The data obtained during the test run is then utilized during an actual production run, in which the process conditions can be determined/inferred by modulating the RF power on various plasma coupling elements, observing the effects of the modulation on signals from the same, or other, plasma coupling elements, and constructing an observed modulation profile from these measurements. To determine the current process conditions, the system uses either (1) the stored modulation profile (i.e., the profile from the database obtained during test runs) that most closely matches the observed modulation profile, or (2) a neural network which predicts the current process conditions from the observed modulation profile. When using the first method, the database links this stored profile to a set of stored process conditions. The current process conditions are thus determined/inferred, based on these stored process conditions. For example, in a plasma etching system having a plasma coupling element, the RF power being supplied to this element can be amplitude modulated at a certain modulation frequency and modulation amplitude. The resulting modulation response signal is observed by measuring the voltage at, e.g., a node of the power delivery circuit. The amplitude of the modulation response signal can have one value during the etching of a film and a second value after the etching has been completed, based upon empirical data obtained in a test run. The plasma state (and therefore, the process state) during etching is associated with a first modulation profile, and the plasma state (and the process state) after etching is associated with a second modulation profile. Each of the profiles in this example would contain a single data point, corresponding to the amplitude of the modulation response signal. During a processing run, the modulation response signal can then be utilized to determine the end point of an etching process, i.e., when the second modulation profile is detected. When using the second method, the neural network determines the end point of an etching process. An observed modulation profile is applied as an input to the neural network to determine when etching is complete without requiring an exact match of a modulation profile.

According to the present invention, it has been recognized that the characteristics of the aforementioned modulation response signals can be sensitive to changes in plasma and system conditions, and the progress of a reaction. Consequently, a more accurate or complete "picture" of the process conditions can be obtained as compared with conventional systems. In addition, since process/system conditions can be extremely well-characterized, deviations from the desired process conditions can be accommodated or cancelled out by modifying the characteristics of the RF power. Further, when using a neural network, small errors are naturally compensated for by the neural network. Alternatively, when it is determined that conditions are unsuitable, corrective action can be taken, while preventing or minimizing damage to the equipment or substrates being processed. Therefore, improved consistency/repeatability of the process and resulting product is achieved. According to another aspect of the invention, a wide variety of process conditions and/or observed modulation effects/responses can be displayed on a monitor screen, so as to rapidly give an operator useful information regarding the process or status of the process.

The invention offers several advantages over conventional systems. In particular, by modulating the RF power and observing the modulation response signals in the electrical circuits of the system, the current characteristics of a plasma can be determined to a greater degree than optical detection or timing methods used in conventional systems. In addition, the invention allows plasma processing systems to be thoroughly tested and characterized under well-controlled conditions before delivery or use in manufacturing substrates, so as to provide quality assurance of the systems, as well as insuring the accuracy of the database used to analyze the modulated signals. These features allow for more precise control of the manufacturing processes, thereby improving the quality assurance of the wafers (or other substrates) being produced. Moreover, improving the quality assurance results in fewer defective wafers, so that the manufacturing yield is increased and manufacturing costs are decreased. Furthermore, the information obtained by the modulation technique can be displayed in an easily-understandable format, on a monitor screen, in order to allow an operator to accurately monitor the system or a process being performed and to detect problems. This results in improved reliability and reduced risk of operator error.

BRIEF DESCRIPTION OF THE DRAWINGS

A more complete appreciation of the invention and many of the attendant advantages thereof will become readily apparent from the following detailed description, particularly when considered in conjunction with the accompanying drawings, in which:

FIG. 10 is an example of a flowchart of a procedure used to collect modulation sideband information for use in a plasma processing system;

DESCRIPTION OF THE PREFERRED EMBODIMENTS

Figure 1:
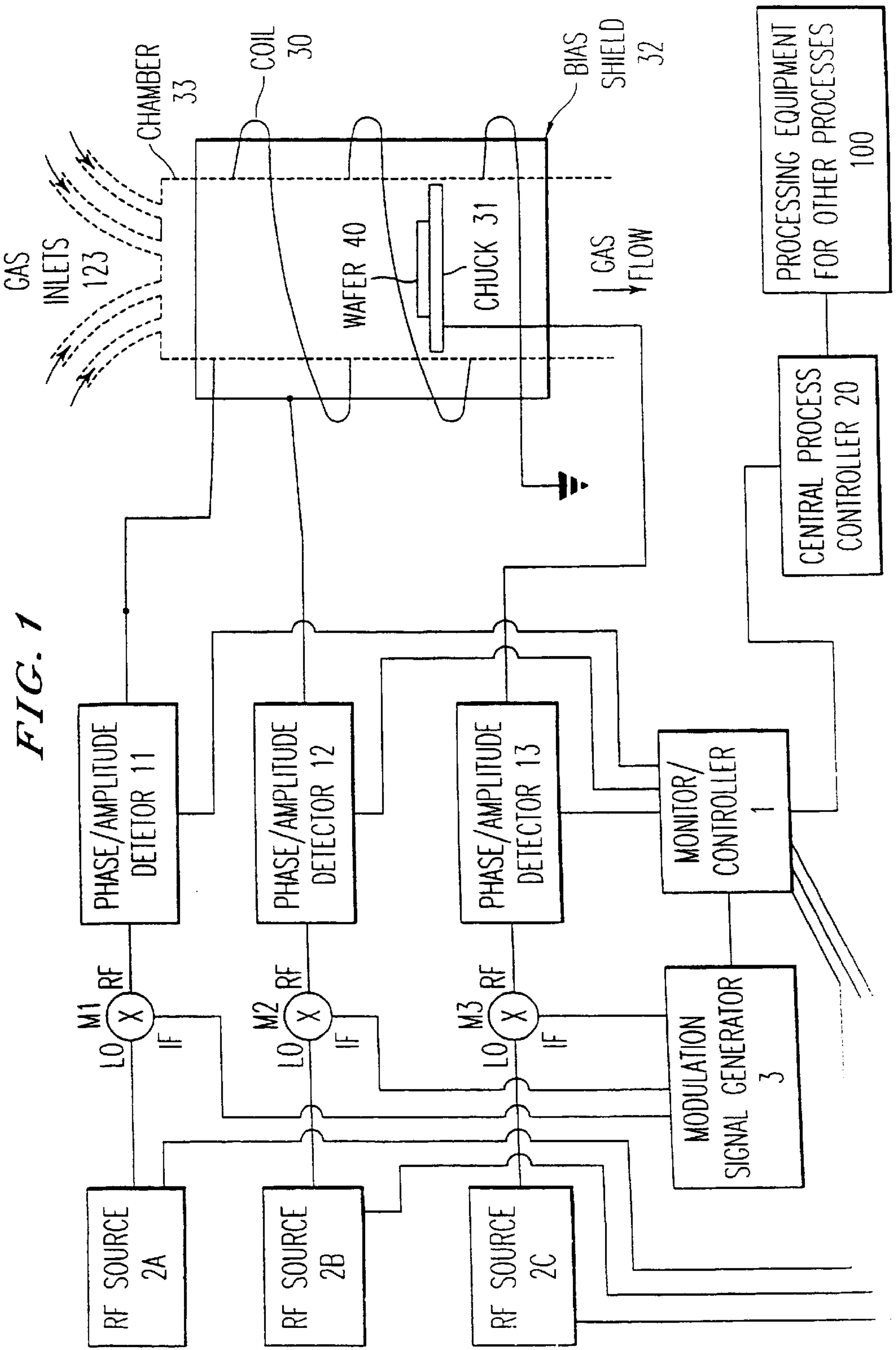
FIG. 1 is a block diagram of a plasma processing system.

Referring now to the drawings, wherein like reference numerals designate identical or corresponding parts throughout the several views, FIG. 1 illustrates an embodiment of a plasma processing system, which includes a monitor/controller 1 and a modulation signal generator 3. Although the exemplary embodiments of the present invention are described in the context of systems using RF power, it is to be understood that the invention can also be utilized in systems in which the power source operates at other frequencies or frequency ranges. In addition, although the system in FIG. 1 includes both inductive and capacitive plasma coupling elements, it is to be understood that various aspects of the present invention can also be advantageously utilized in other types of systems. For example, the invention can also be utilized in systems which do not include inductive plasma coupling elements (e.g., sputtering systems).

In the FIG. 1 arrangement, gases, such as oxygen and chlorine, are introduced into a processing chamber 33 through gas inlets 123. The gases are excited into a plasma state using RF power, in order to react with a substrate such as a semiconductor wafer 40. RF sources 2A, 2B, and 2C send RF power into the local oscillator (LO) terminals of mixers M1, M2, and M3, respectively. A power varying controller, such as a modulation signal generator 3, sends modulation signals into the intermediate frequency (IF) terminals of mixers M1, M2, and M3, respectively. As is well known in the art, the signal provided at the radio frequency (RF) terminal of a mixer contains the product of the signals sent into the LO and IF terminals of the mixer. If the IF signal contains a sinusoidal component, with no DC component, the frequency spectrum of the modulated signal at the RF terminal of the mixer contains two components at sideband frequencies (i.e., frequencies adjacent to the LO frequency). One sideband frequency is equal to the "difference frequency" of the LO frequency and the IF frequency (i.e., the LO frequency minus the IF frequency). The other sideband frequency is equal to the "sum frequency" of the LO and IF frequencies (i.e., the LO frequency plus the IF frequency). If the IF signal also contains a DC component, the modulated signal contains a component at the local oscillator (LO) frequency, in addition to the aforementioned sideband components. In addition, if the IF signal contains components at a number of different frequencies, the modulated signal contains additional sideband components. Each additional sideband component is at a frequency corresponding to the sum or difference of the LO frequency and the frequency of one of the IF components. Each additional component in the IF signal produces two additional sidebands, one below the LO frequency and the other above the LO frequency.

In a presently preferred embodiment of the invention, the LO frequency is 13.56 MHZ, while the frequencies of the IF components are significantly lower (e.g., below 1 MHZ), which causes the differences between the sideband frequencies and the LO frequency to be significantly smaller (e.g., less than 1 MHZ) than the LO frequency. That is, in comparison with the LO frequency, the sideband sidebands appear close in frequency to the LO component.

The modulation signal generator 3, and the frequencies and amplitudes of modulation produced by it, are controlled by monitor/controller 1. Mixers M1, M2, and M3 provide, at their RF terminals, modulation response signals, which are sent into monitoring sensors, such as phase/amplitude detectors 11, 12, and 13, respectively. The phase/amplitude detectors provide information regarding characteristics of various frequency components of the modulation response signals (i.e., the signals from a set of plasma coupling elements). Each characteristic of a frequency component can correspond to one of two possible characteristic types, the two possible characteristic types being an amplitude and a phase. Frequency components of interest include response components caused by varying the amplitude, frequency and/or phase of the RF power supplied by one or more of the RF sources. By using a mixer, the amplitude of the RF power can be varied. In the illustrated embodiment, the plasma coupling elements include coil 30, electrostatic chuck 31, and bias shield 32. The RF power passes through the respective phase/amplitude detectors and is sent to the respective plasma coupling elements. The outputs of the phase/amplitude detectors (11, 12 and 13) are sent into the monitor/controller 1 for analysis. A central process controller 20 controls the devices used for this processing step, as well as processing equipment 100 for other steps.

Alternatively, a power varying controller may vary the amplitude, frequency and/or phase of an RF source by sending a control signal into control circuitry internal to the source or control circuitry external to the source. The resulting RF power can be amplitude modulated, as would result from using a mixer, but may also have a combination of varying amplitudes, frequencies and/or phases.

Figure 7A:
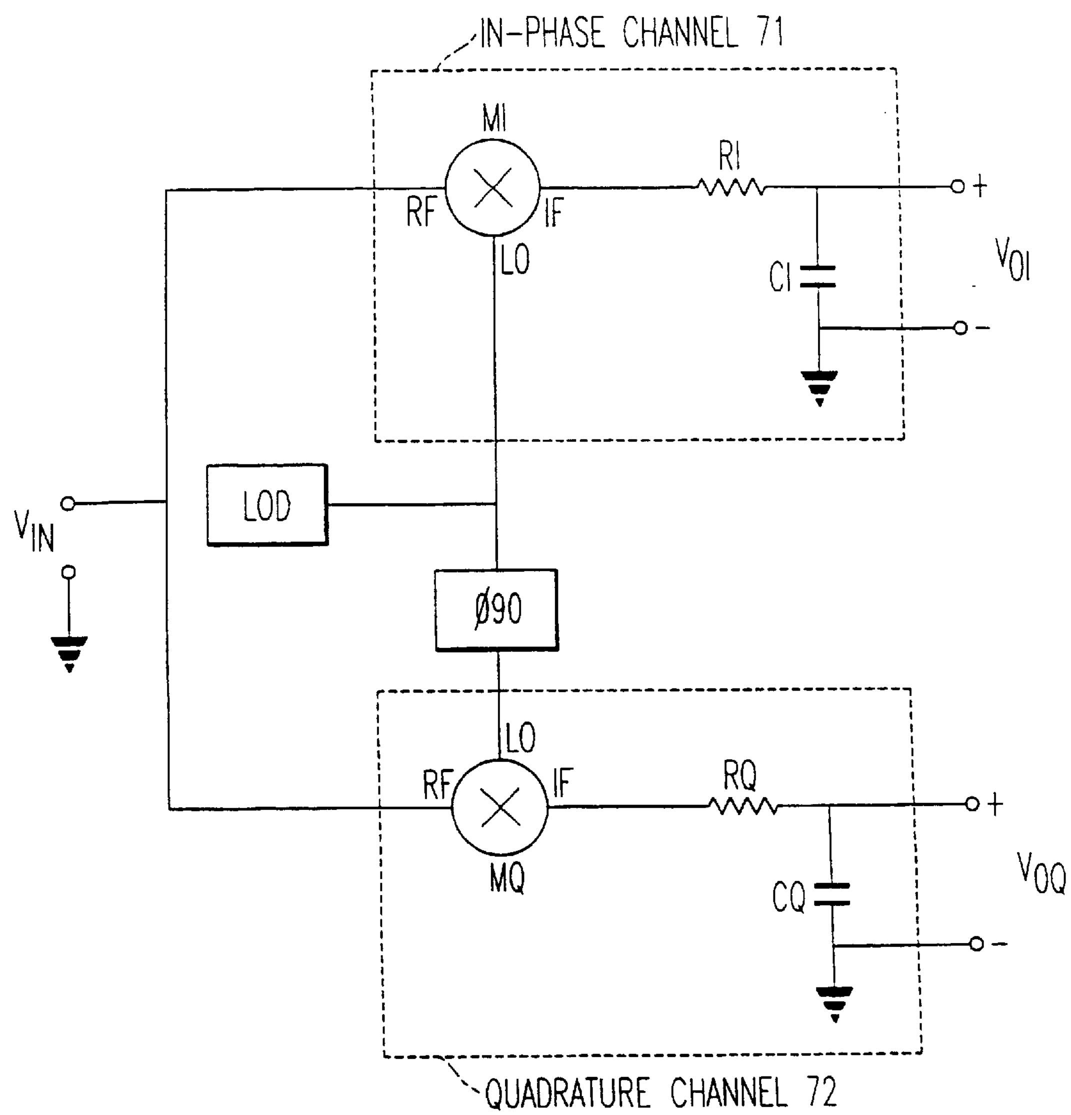
FIG. 7A is a circuit diagram of a demodulator with in-phase and quadrature channels.

In one embodiment of a phase/amplitude detector, the phase and amplitude of a given response component of a plasma signal are determined by demodulating the signal component into "in-phase" and "quadrature" components. FIG. 7A illustrates an example of a circuit used to perform this operation. An input voltage $V_{in}$ is sent into the respective RF terminals of an in-phase mixer MI (which is part of an in-phase channel 71) and a quadrature mixer MQ (which is part of a quadrature channel 72). A local oscillator source LOD provides a signal which is sent into the LO terminal of mixer MI. The signal from LOD is also sent into a phase-shifter $\phi$90, which shifts the phase of the LO signal by 90° and sends it into the LO terminal of mixer MQ. The IF terminal of mixer MI is sent into a low-pass filter, which includes a resistor RI and a capacitor CI. The resulting downconverted and filtered output $V_{OI}$ represents the in-phase component of the input signal $V_{in}$. The IF output of mixer MQ is sent into a low-pass filter, which includes a resistor RQ and a capacitor CQ. The resulting downconverted and filtered signal $V_{OQ}$ represents the quadrature component of the input signal $V_{in}$. The amplitude $|V_{in}|$ of the input voltage can be calculated by the formula:

$$|V_{in}|=\sqrt{(V_{OI})^2+(V_{OQ})^2}$$

The phase ($\phi$) $V_{in}$, relative to the phase of the demodulation local oscillator LOD can be determined from the equation:

$$\phi=\tan^{-1}(V_{OQ}/V_{OI})$$

Figure 7B:
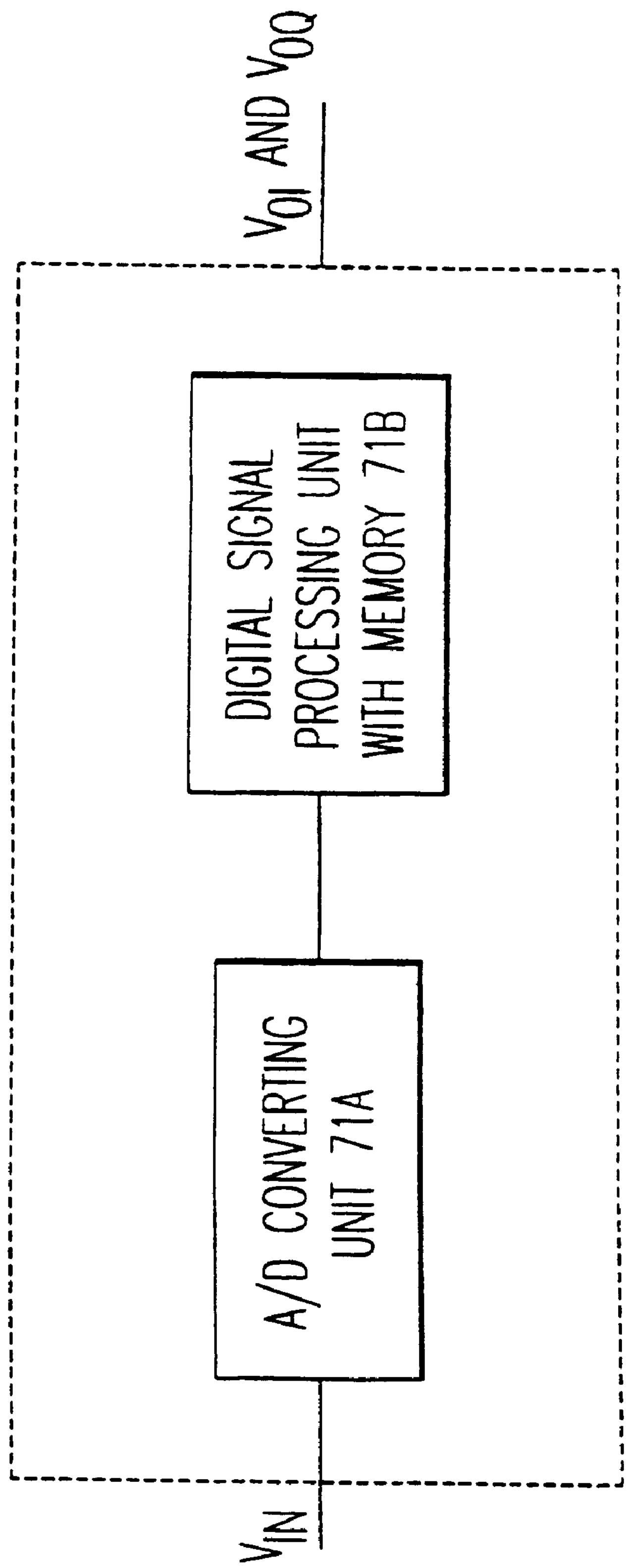
FIG. 7B is a schematic illustration of a DSP-based demodulator.

The specific modulation response signal component which is being measured can be selected by choosing the frequency of local oscillator LOD. It should be noted that while the circuit illustrated in FIG. 7A is one method of determining amplitude and phase of a signal component, other techniques may be used, as would be readily apparent to one skilled in the art. As shown in FIG. 7B, in a presently preferred form of the invention, the monitor/controller 1 (FIG. 1) includes an analog-to-digital (A/D) converting unit 71A and a digital signal processing unit (DSP) including a non-volatile data storage device, such as an EPROM or a disk drive. The A/D converting unit 71A includes plural A/D convertors 1126 that receive analog signals from the respective phase/amplitude detectors, and convert the analog signals into digital numbers. The DSP (or a properly programmed CPU) analyzes and organizes this information and stores it in the non-volatile data storage device. Such a conversion includes performing a Fast Fourier Transform (FFT) on the input to convert the input from the time domain to the frequency domain. The DSP (or CPU) also retrieves data from the storage device and compares it with new data being received from the phase/amplitude detectors.

Figure 8:
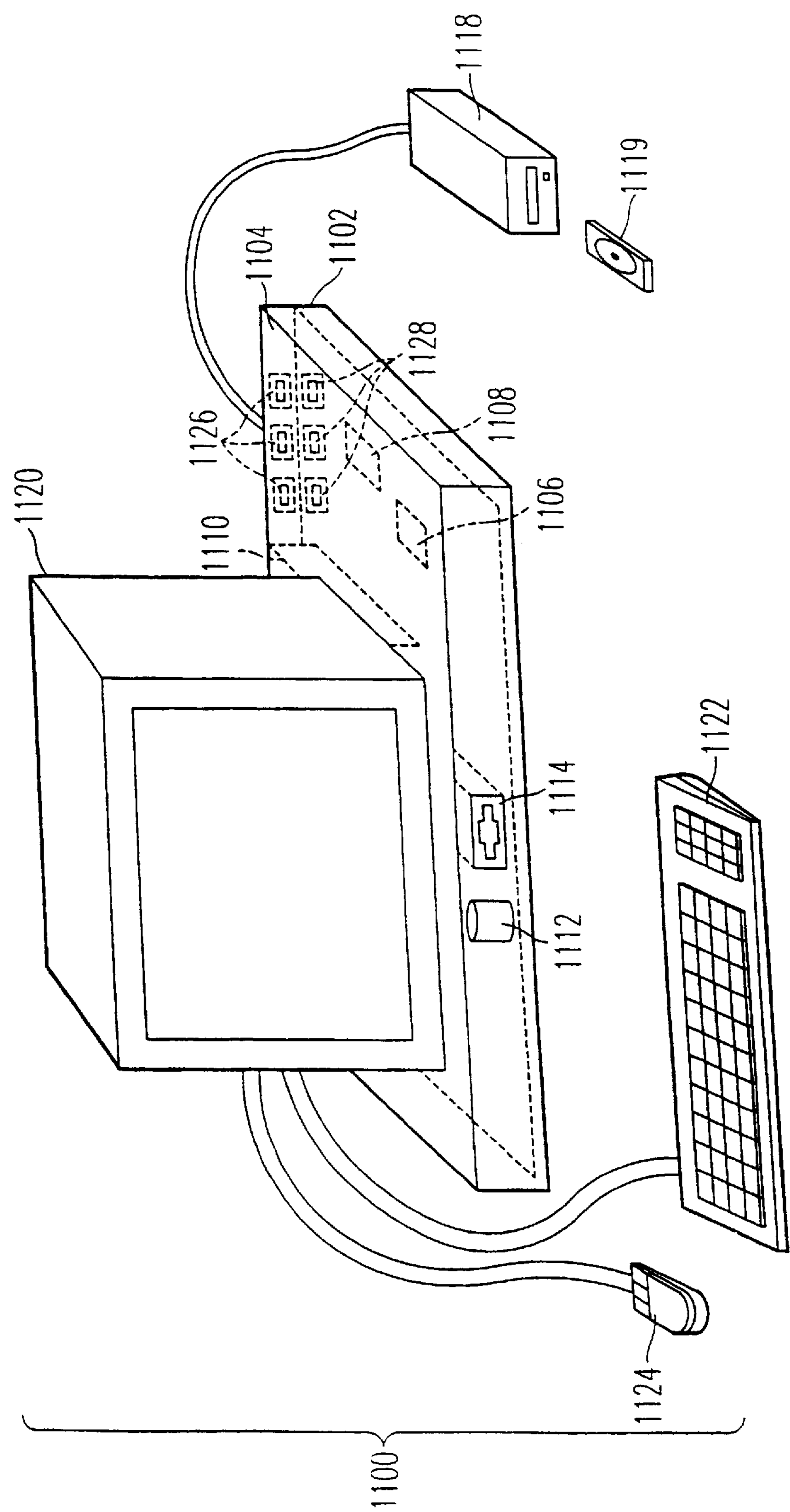
FIG. 8 is a block diagram of a computer system for use as a monitor/controller or a central process controller.

According to an exemplary embodiment, the monitor/controller is a computer system, illustrated schematically in FIG. 8. The computer system 1100 has a housing 1102 which houses a motherboard 1104 which contains a central processing unit (CPU) 1106, memory 1108 (e.g., DRAM, ROM, EPROM, EEPROM, SRAM and Flash RAM), and other optional special purpose logic devices (e.g., ASICs) or configurable logic devices (e.g., GAL and reprogrammable FPGA). In addition, according to the invention, the computer system contains analog-to-digital (A/D) inputs 1126 for receiving signals from the various phase/amplitude detectors 11, 12, and 13 (FIG. 1). The computer also contains communication ports 1128 (FIG. 8) for communicating with a central process controller 20, a modulation signal generator 3 and RF sources 2A–2C (FIG. 1). The computer 1100 (FIG. 8) further includes plural input devices, (e.g., a keyboard 1122 and mouse 1124), and a display card 1110 for controlling monitor 1120. In addition, the computer system 1100 includes a floppy disk drive 1114; other removable media devices (e.g., compact disc 1119, tape, and removable magneto-optical media (not shown); and a hard disk 1112, or other fixed, high density media drives, connected using an appropriate device bus (e.g., a SCSI bus or an Enhanced IDE bus). Although compact disc 1119 is shown in a CD caddy, the compact disc 1119 can be inserted directly into CD-ROM drives which do not require caddies. Also connected to the same device bus or another device bus as the high density media drives, the computer 1100 may additionally include a compact disc reader 1118, a compact disc reader/writer unit (not shown) or a compact disc jukebox (not shown). In addition, a printer (not shown) can also provide printed copies of important information related to the process, e.g., sideband phases and amplitudes, RF power levels, and process conditions, as determined from analysis of the sideband components, as discussed in further detail hereinafter. Operation of the plasma controller, such as records of RF power levels and arcing behavior can also be displayed and/or printed.

The computer system further includes at least one computer readable medium. Examples of such computer readable media are compact discs 1119, hard disks 1112, floppy disks, tape, magneto-optical disks, PROMs (EPROM, EEPROM, Flash EPROM), DRAM, SRAM, etc.

Stored on any one or on a combination of the computer readable media, the present invention includes software for controlling both the hardware of the computer 1100 and for enabling the computer 1100 to interact with a human user and the controlled system(s). Such software may include, but is not limited to, device drivers, operating systems and user applications, such as development tools. Such computer readable media further includes a computer program, according to the present invention, for operating the monitor/controller.

The monitor/controller can serve as a remote computer, and can allow an operator to "log on" to a host computer which may be a central process controller 20 (FIG. 1) controlling not only this particular process but other processes in the fabrication line which use their own equipment 100. The host computer, which can be of a form similar to the computer system of FIG. 8, can restrict the possible choices that the operator is allowed to make while performing the process, thus reducing the risk of operator error, and allowing for the employment of less-skilled operators without harming the control over the process. Likewise, in an alternate embodiment, the plasma controller is controlled through a GUI, such as a client-server program or using a WWW interface (including CGI scripts, ActiveX components and Javascript).

As should be apparent, the invention may be conveniently implemented using a conventional general purpose digital computer or microprocessor programmed according to the teachings of the present specification, as will be apparent to those skilled in the computer art. Appropriate software coding can be prepared based on the teachings of the present disclosure, as will be apparent to those skilled in the software art. The invention may also be implemented by the preparation of application specific integrated circuits or by interconnecting an appropriate network of conventional component circuits.

Figure 3:
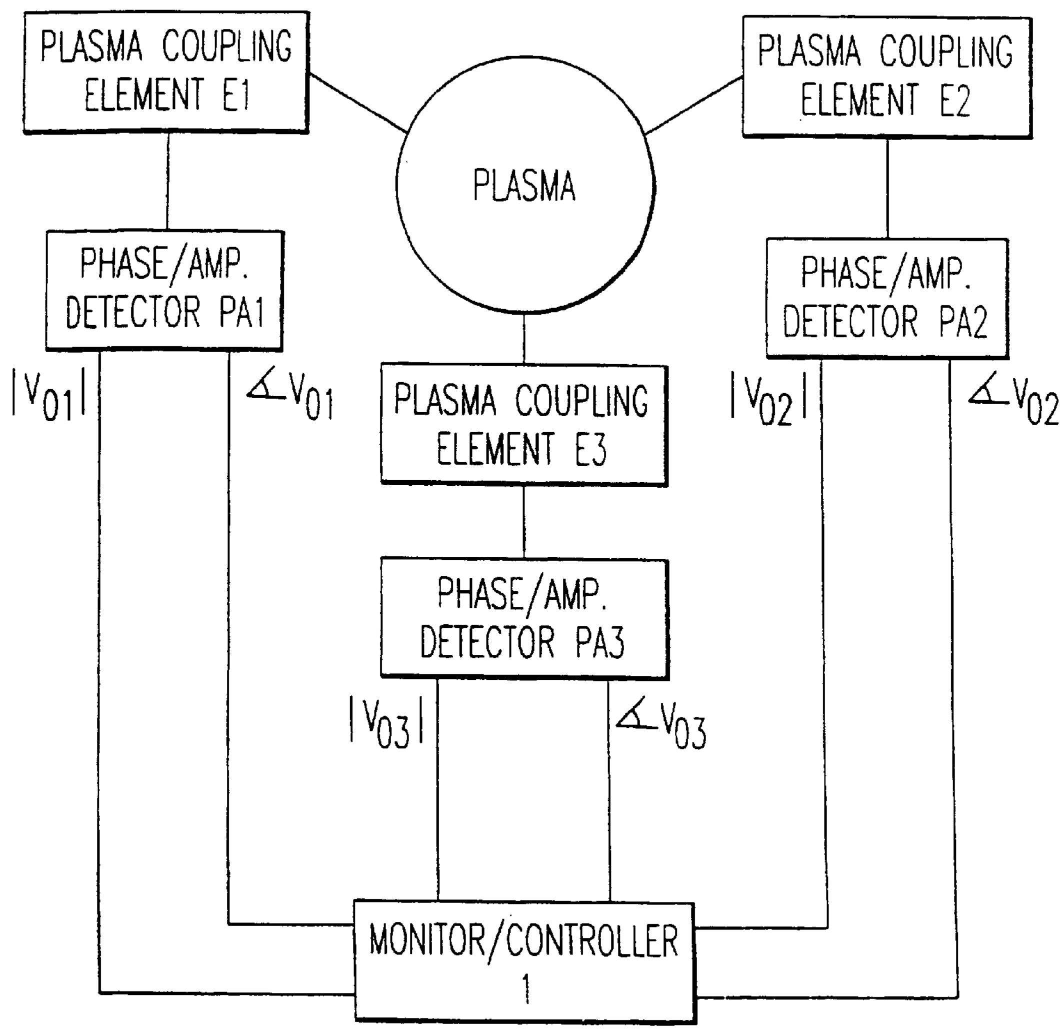
FIG. 3 is a block diagram representing a plasma coupled to three plasma coupling elements.

FIG. 3 is a block diagram of an arrangement according to the invention which includes three plasma coupling elements E1, E2, and E3, coupled to a plasma, as well as three independent phase/amplitude detectors PA1, PA2, and PA3, which measure the phase and amplitudes of the voltages $V_{01}$–$V_{03}$ on the plasma coupling elements. Also shown is a monitor/controller 1, which receives phase and amplitude information from each of the phase/amplitude detectors (which thus act as monitoring sensors receiving response signals from the plasma coupling elements).

The RF signals sent into plasma coupling elements E1, E2, and E3 are modulated at modulation frequencies $F_{M1}$, $F_{M2}$, and $F_{M3}$, respectively. In one embodiment, E1, E2, and E3 are a plasma coupling coil 30, an electrostatic shield or bias shield 32, and a wafer holding chuck 31. Exemplary operating values of $F_{M1}$, $F_{M2}$, and $F_{M3}$ are 240 kHz, 116 kHz, and 500 kHz, respectively. As shown in FIGS. 4A–4F, the modulation has the effect of producing sideband signals (i.e. sideband components) surrounding the fundamental frequency on each of output voltages $V_{01}$, $V_{02}$, and $V_{03}$, corresponding to the measured voltages on plasma coupling elements E1, E2, and E3, respectively. Each output voltage contains a component at the fundamental frequency of the RF source and may contain components at harmonics of this fundamental frequency. Adjacent in frequency to each component at the fundamental and harmonic frequencies are the sideband components.

Figure 4A:
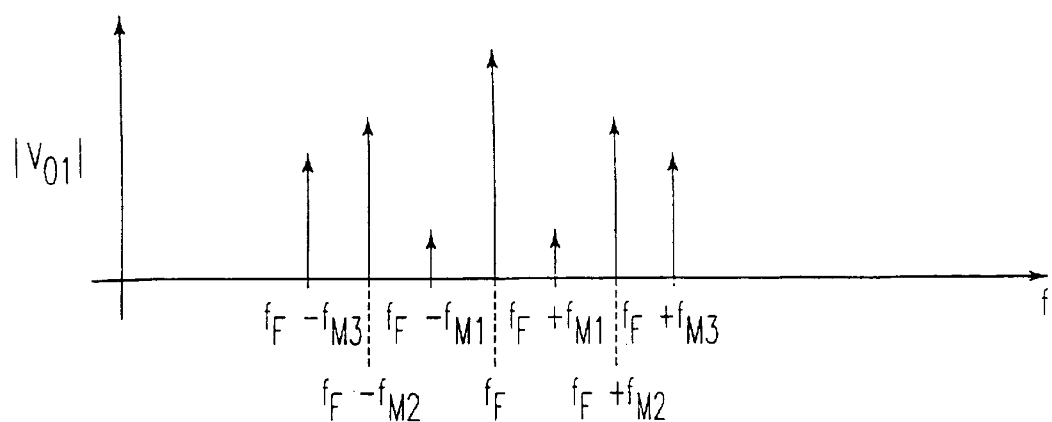
FIGS. 4A–4C are exemplary graphs of portions of frequency-domain spectra of voltage amplitudes measured at plasma coupling elements.
Figure 4B:
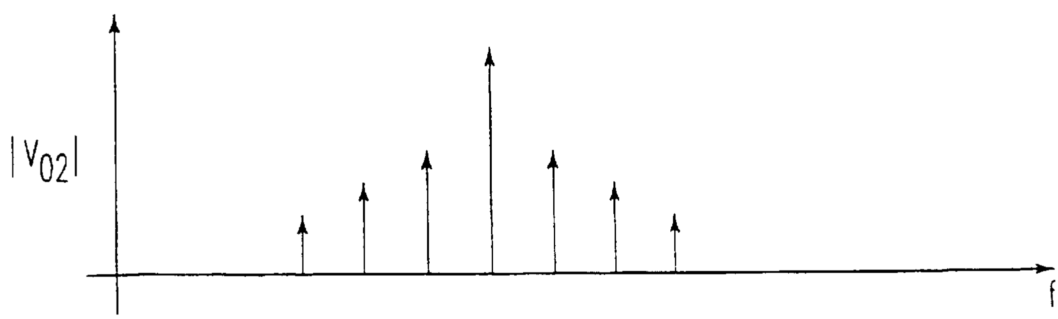
Figure 4C:
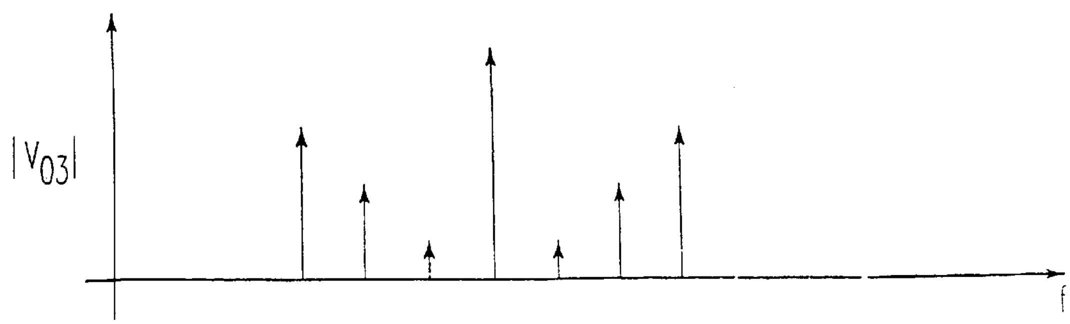
Figure 4D:
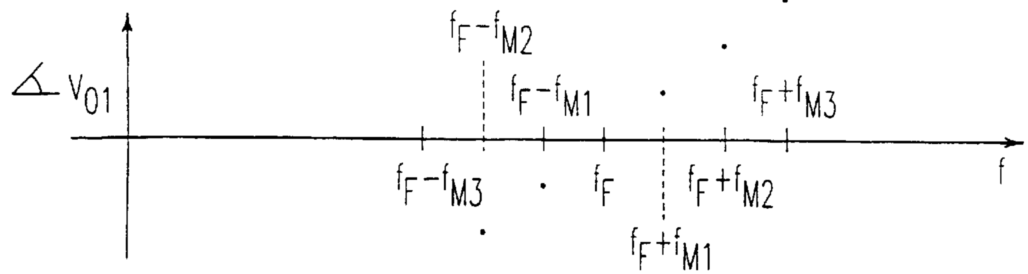
FIGS. 4D–4F are exemplary graphs of portions of frequency-domain spectra of voltage phases measured at plasma coupling elements.
Figure 4E:
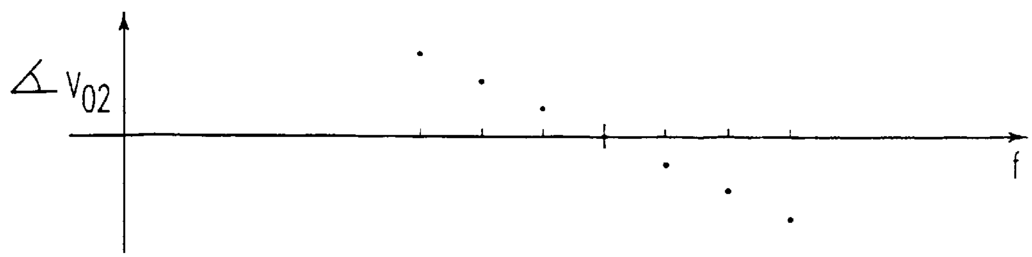
Figure 4F:
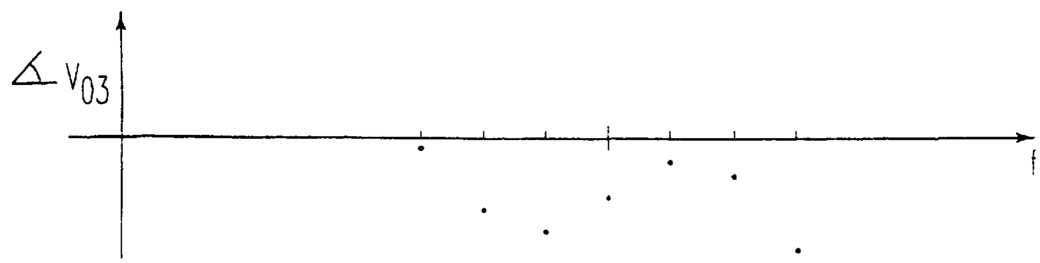
Figure 5:
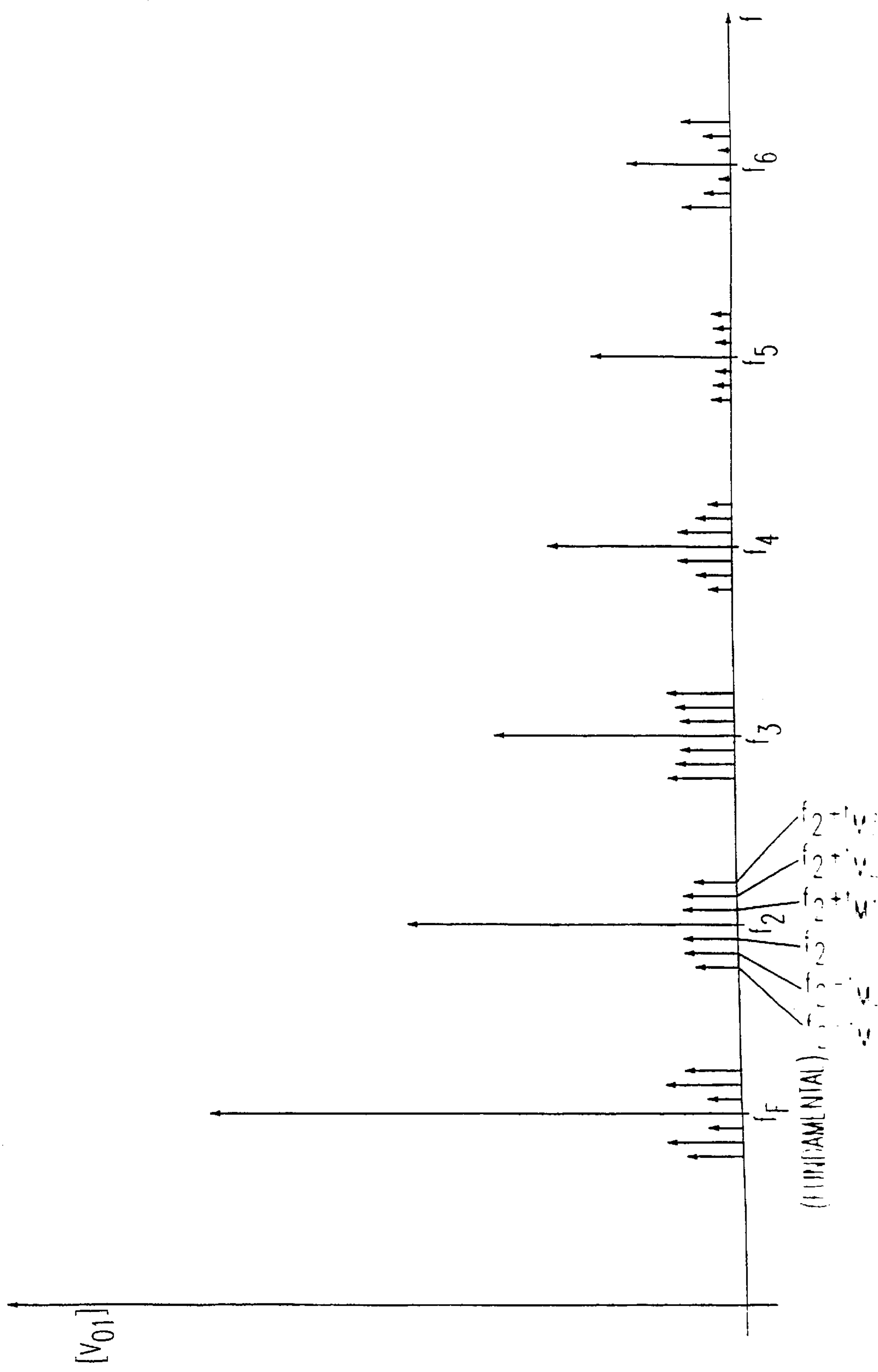
FIG. 5 is an exemplary graph of a portion of a frequency-domain spectrum of voltage amplitude measured at a plasma coupling element.

FIGS. 4A–4C illustrate an exemplary spectrum of signal amplitudes of components of voltages measured at a plasma coupling element. Components appear at the frequencies $f_F-f_{M3}$, $f_F-f_{M2}$, $f_F-f_{M1}$, $f_F$, $f_F+f_{M1}$, $f_F+f_{M2}$, and $f_F+f_{M3}$, where $f_F$ is the fundamental frequency and $f_{M1}$, $f_{M2}$, and $f_{M3}$ are the aforementioned modulation frequencies. FIGS. 4D–4F illustrate the respective phases of the signals shown in FIGS. 4A–4C. For simplicity, only the frequency range near the fundamental frequency is shown in these figures. The frequency range near each harmonic also contains sideband signals as illustrated in FIG. 5, which is a graph of the amplitude of $V_{01}$ over a wider frequency range than that of FIGS. 4A–4F. For example, the frequency range near the second harmonic $f_2$ contains components at the frequencies $f_2-f_{M3}$, $f_2-f_{M2}$, $f_2-f_{M1}$, $f_2$, $f_2+f_{M1}$, $f_2+f_{M2}$ and $f_2+f_{M3}$. The graph of FIG. 5 shows not only the frequency range near the fundamental frequency, but also the frequency ranges near the lowest five harmonics.

Each sideband component has a phase, relative to that of the component at the fundamental frequency, and an amplitude. The phase and amplitude of the sideband component can depend upon several factors, including the plasma conditions (e.g., ion density, gas mixture, and gas pressure), the system conditions (e.g., proper assembly of RF connections and other components, the thickness of accumulated reaction products, aging of the system or system components, RF matching, and/or other contamination of or damage to the system), the particular plasma coupling element receiving the corresponding modulated RF power, the particular plasma coupling element being observed, and the progress of the reaction (e.g., whether or not an etching step is complete).

Figure 2:
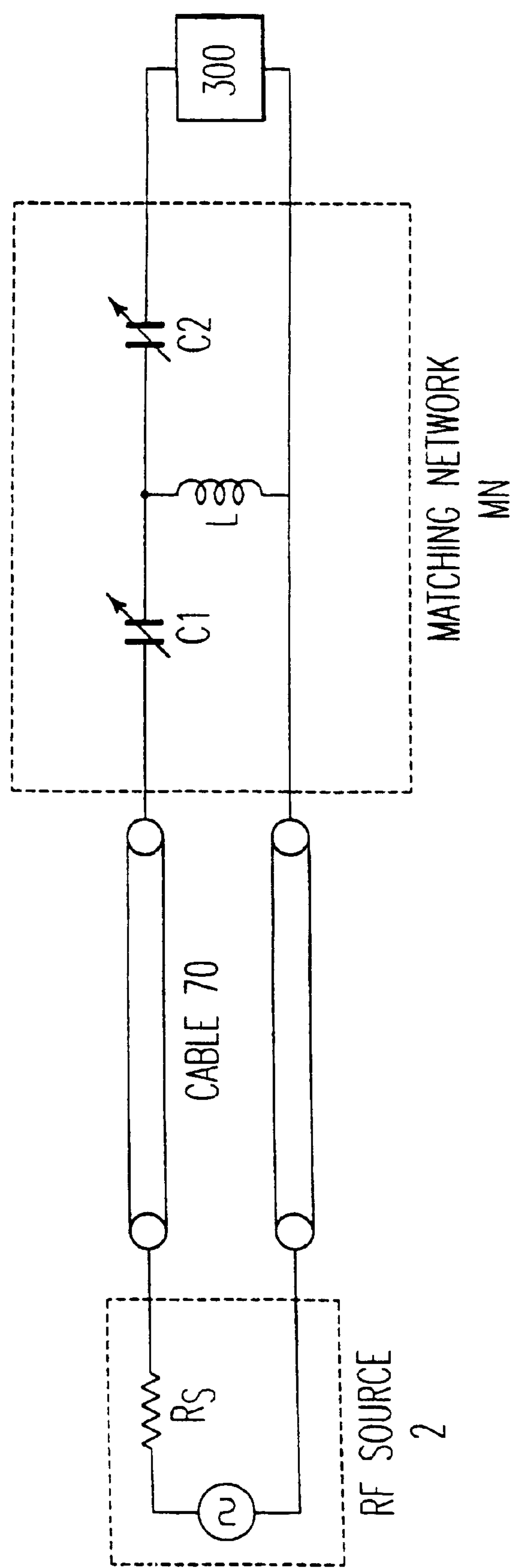
FIG. 2 is a schematic diagram of a circuit, including a matching network, used to deliver power to a plasma.

The observed electrical signals or modulation response signals of the plasma coupling elements can be received, e.g., from a node of a power delivery circuit, one example of which is illustrated schematically in FIG. 2. In this example, the power delivery circuit includes an RF source 2 which sends power through a cable 70 into a matching network MN. The matching network MN, which in this example includes an inductor L and variable capacitors C1 and C2, electrically matches the output impedance $R_S$ of the source to the impedance of a load 300. The load 300 is a plasma coupling element, which receives the RF power from the RF source. In accordance with one arrangement, the electrical signals measured by the monitor/controller (represented as 1 in FIG. 1) are received from a node of a matching network of the power delivery circuit (FIG. 2). Alternatively, the observed electrical signals or modulation response signals of a plasma coupling element can be more directly obtained, e.g., by obtaining a signal directly from the plasma coupling element. It is to be understood that signals containing useful information could be received from other elements of a plasma processing system. Other elements which could be utilized to provide signals include, but are not limited to, an RF source and an antenna or probe coupled to the plasma (e.g., with the probe or antenna disposed in the process chamber). In addition, it is to be understood that signals can be obtained from one element or plural elements in order to provide information regarding the conditions or state of the process without deporting from the invention.

The monitor/controller 1 analyzes the relative amplitudes and phases of the sideband components and constructs a modulation profile corresponding to the current conditions of the plasma and/or the system equipment. The amplitude spectrum of $V_{01}$ illustrated in FIG. 5 contains 42 signal components, each with a measurable amplitude. Therefore, this spectrum can be used to obtain at least 42 data points. However, this could be only a small part of a complete modulation profile. The profile could also contain data points for the phase of $V_{01}$, as well as the amplitudes and phases of $V_{02}$ and $V_{03}$. In addition, although the profile is illustrated only up to the sixth harmonic in FIG. 5, it could also contain data points at higher harmonics. Furthermore, although this example uses only three fixed modulation frequencies, $F_{M1}$, $F_{M2}$, and $F_{M3}$, for the three plasma coupling elements, respectively, a modulation profile may contain data points corresponding to a variety of different modulation frequencies. As discussed earlier, the amount of information obtained and utilized can vary depending upon the level of sophistication of a particular system, and whether the system is utilized for monitoring a limited number of conditions (e.g., end point detection) or for comprehensively monitoring a wide variety of conditions throughout a process.

The current patent has proposed two primary approaches to the intelligent control of a plasma process; namely, (1) the use of a stored modulation profile (i.e., the profile from the database obtained during test runs), or (2) a neural network. Both approaches use a matrix of test runs to characterize the behavior of the plasma system. The first approach stores modulation profiles representative of the plasma conditions (which could later be extracted from the database during run conditions). The second electrical properties (such as the modulation profiles) of the system to train the neural network on the normal behavior of the plasma system.

Analysis according to the present invention will be discussed below in terms of profiling techniques and neural network processes. However, it should be evident to one of ordinary skill in the art that the modulation profile can also be applied to other intelligent control systems such as fuzzy logic or expert systems. Outputs of a fuzzy logic system have an advantage of describing conditions generally, e.g., medium gas mixture, low pressure or high pressure.

According to the profiling aspect of the invention, by observing the modulation profile during a processing run, and comparing this observed profile to known profiles in a preexisting database, information regarding the process conditions and/or the progress of a processing step can be determined. The set of modulation profiles which is characteristic of the processing system is stored as an array of data points, each corresponding to a specific set of parameter values. The parameters representing a specific set of process conditions indicate which modulation profile is being referenced. The parameters specifying which portion of a profile is being referenced indicate a specific harmonic or fundamental frequency, a specific plasma coupling element for which the signal is being modulated, a specific plasma coupling element which is being observed, specific values of phase and amplitude of the RF power, and/or specific values of the variable elements in the matching networks.

By way of example, a "before or after" parameter B indicates whether a modulation profile corresponds to the process before the completion of an etching step (B=0) or after the completion of an etching step (B=1). A "which harmonic" parameter H indicates which harmonic is being referred to within this modulation profile. For example, H=1 refers to the fundamental, while H=2 refers to the second harmonic, and so on. A "which sideband" parameter S refers to a specific sideband near the aforementioned harmonic. For example, S=1 refers to the sideband closest to, and above, the specified harmonic, S=−1 refers to the sideband closest to, and below, the specified harmonic, S=2 refers to the next furthest sideband above the specified harmonic, S=−2 refers to the next furthest sideband below the specified harmonic, and so on. By specifying these three parameters, a data point in the database is uniquely identified, allowing the data to be retrieved. In this example, the data is the amplitude of the specified sideband. More specifically, the amplitude |V(B,H,S)| of a specified sideband corresponding to a specified process condition depends upon which sideband is referenced and which process condition is specified. For example, |V(0,2,1)| may equal 1 mV, while |V(1,2,1)| equals 2 mV. This indicates that the first sideband above the second harmonic before the etching step is completed has an amplitude of 1 mV, whereas the same sideband after the completion of the etching step has an amplitude of 2 mV. As should be readily apparent that, since the system of this example considers three parameters (B,H,S), the data can be organized according to these three parameters in a three-dimensional array. If an additional parameter, such as gas pressure, is considered, the data is organized into a four-dimensional array. If still another parameter, such as the proportion of a specific gas within the gas mixture, is considered, the data is organized in a five-dimensional array. However, the data is usually used in a reverse process. As an example, after measuring an amplitude of 1.1 mV, the system can cycle through all B values for a fixed pair of H and S values to determine which known state the system currently resembles. By doing so with the parameters above, the system can determine that the current amplitude (1.1 mV) is closer to the stored "before" condition (1 mV) than the stored "after" (2 mV) condition.

The number of dimensions of this array is dependent upon the number of modulation parameters required for determining the information desired regarding the state or conditions of the process or of the system. For example, if the data is organized by every possible combination of pressure, relative proportions of two different gases, RF power levels into each of plasma coupling elements E1, E2, and E3, reaction progress B, harmonic H, and sideband S, the database will contain a seven-dimensional array of data. Like in the three-dimensional example, the system can use less than all seven parameters to index the database to find all profiles with those characteristics. Then, the amplitude data can be used to determine which profile (most closely) matches thereby giving an estimate of current conditions. The parameters mentioned above are cited only as examples, and it is to be understood that the invention is not limited to these parameters. Other parameters may be utilized, including, but not limited to, RF frequencies, relative phases of the power waveforms received by the plasma coupling elements, and the values of the tunable elements in the matching networks.

An exemplary procedure for obtaining and storing data in the database is illustrated in FIG. 10. In this example, a system with three separate plasma coupling elements is tested and characterized both before and after a process is complete using a variety of different combinations of power levels supplied to the three plasma coupling elements. For simplicity, other input parameters such RF matching, are assumed to be constant during the process, and output parameters of interest, if any, such as temperature, cleanliness, are periodically measured. In steps 700 and 701, the system parameters are initialized to a set of initial values. Then, the power levels supplied to the three plasma coupling elements are incremented by predetermined amounts (steps 702, 703, and 704). Once the power levels are set, the RF power sent into at least one of the plasma coupling elements is modulated and the phases and amplitudes of the resulting sidebands are measured (Step 705), along with output parameters discussed above. Then, in step 706, this sideband information, and any of the output parameters, and an indication of whether or not the process had completed are stored in the database, along with the values of the power levels supplied to the respective plasma coupling elements. If in step 710 it is determined that the current value of P1 is the final value which is to be tested (i.e., the maximum value of P1 to be tested), the procedure continues to step 708. If not, the procedure returns to step 704, at which point the power level $P_1$ supplied to the first plasma coupling element is incremented by a predetermined step and the measurement loop is repeated with the new value of $P_1$. In step 708, $P_1$ is set to its initial value and, if the current conditions do not correspond to the final level of $P_2$ (step 709), the procedure returns to step 703, at which point $P_2$ is incremented by a predetermined amount and the measurement loop is repeated for this value of $P_2$. If, in step 709, $P_2$ is the final value, the procedure continues to step 730, which resets $P_2$ to its initial value, at which point the procedure continues to step 712 (which checks to determine whether or not the current value of $P_3$ is the final value). If $P_3$ is not the final point, the procedure returns to step 702, at which point $P_3$ is incremented by a predetermined amount, and the measurement loop is repeated with the new value of $P_3$. In step 712, if $P_3$ is the final value, the procedure continues to step 713, at which point, if there are no other system parameters (i.e., parameters other than the various levels of RF power) to be investigated, the procedure is terminated (step 715). If there are other parameters of interest (e.g., RF matching parameters), the procedure continues to step 714, at which point the other parameters are changed and the procedure repeats itself, starting from step 701.

It is to be understood that the procedure of FIG. 10 represents one example in which only RF power levels are varied, and it should be readily apparent to those skilled in the art that other parameters can also be varied and other variation sequences can be utilized during characterization of the system. For example, the power can be held constant while another condition such as gas flow rate is varied.

Figure 9A:
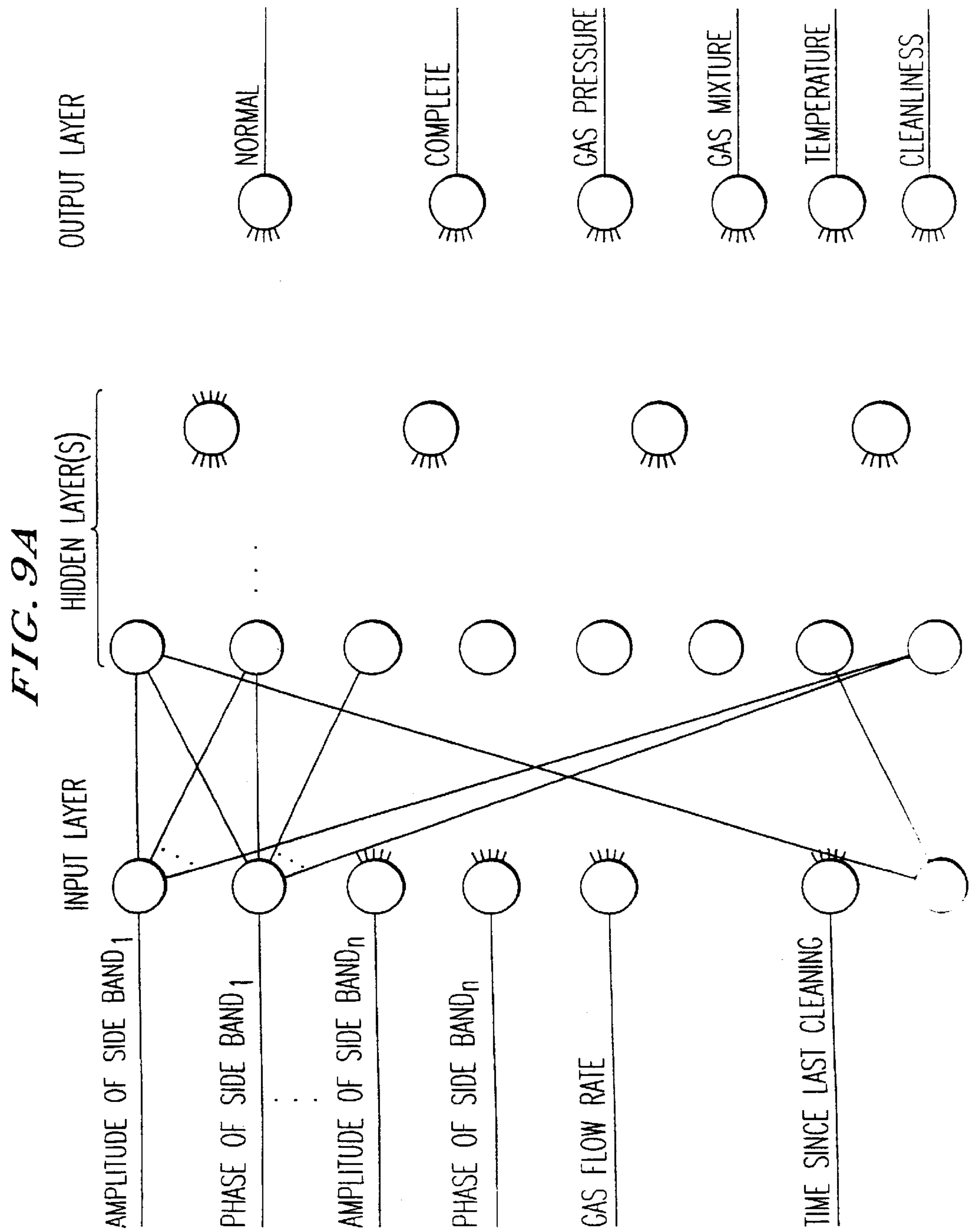
FIG. 9A is a schematic illustration of a trained neural network used to determine current process conditions of a plasma process.

An example of a processing step which can be analyzed by the invention is the etching of an aluminum metallization layer on a silicon substrate. Prior to using the system for this process in a production run, modulation profiles characteristic of the processing system are obtained by performing a series of test runs of the system. Some of the test runs are performed under conditions identical to those of a production run during etching, and other test runs are performed under conditions matching those of a production run after completion of etching. This data can be obtained empirically in the preproduction stage of the system so that the data can be stored in the monitor/controller 1 (in FIGS. 1 and 3) or the central process controller 20 (in FIG. 1) when the system is manufactured. Alternatively, for existing equipment, data can be obtained for that type of equipment and provided in a controller/memory module so that the invention can be utilized on a retrofit basis. When using a neural network, the input parameters of the measured profiles are fed into a trained neural network as shown in FIG. 9A. The neural network is trained to predict "normal" and "complete" states using stored modulation profiles and known desired outputs. Any appropriate training algorithm, such as backpropagation, can be used. Additional details on training neural networks can be found in *The Roots of Backpropagation* by Paul Werbos, Ph.D. Training cycles are repeated until the network properly identifies the normal and complete state from the inputs. As evident to one of ordinary skill in the art, there is an input layer, an output layer, and at least one hidden layer, and the number of neurons in each layer may vary. Likewise, the modulation profiles may be used to detect other states, such as minor or severe arcing.

When using profiling, during an actual production run, the measured modulation profiles are compared to the profiles stored in the database. In this example, most of the process parameters, such as gas flow rate, and RF power levels, are kept constant, for simplicity. The only parameter varied is the progress of the reaction (i.e., whether or not it is finished). The monitor/controller 1 repeatedly measures the modulation profile of the process as the reaction progresses. During the etching of the aluminum, the plasma gas mixture contains a certain percentage of aluminum, whereas, after the etching process has completely removed portions of the aluminum film (thereby exposing the silicon), the gas mixture contains less aluminum. Depending on the process, the gas mixture may, in fact, contain a certain percentage of silicon once the silicon has been exposed, particularly after the completion of the aluminum etching step.

Due to the aforementioned changes in the composition of the plasma gas, the process during the etching of the aluminum has a different modulation profile than the process after completion of the etching. Therefore, the monitor/controller 1 is able to determine when the end of this processing step has occurred. An indication is given to a human operator at this time and/or a signal is sent to a central process controller 20, indicating that this processing step should be terminated and the next step should be started. The process may also have separately distinguishable intermediate steps which could also be separately identified in an alternate embodiment, either by profiling or by a neural network.

Figure 9B:
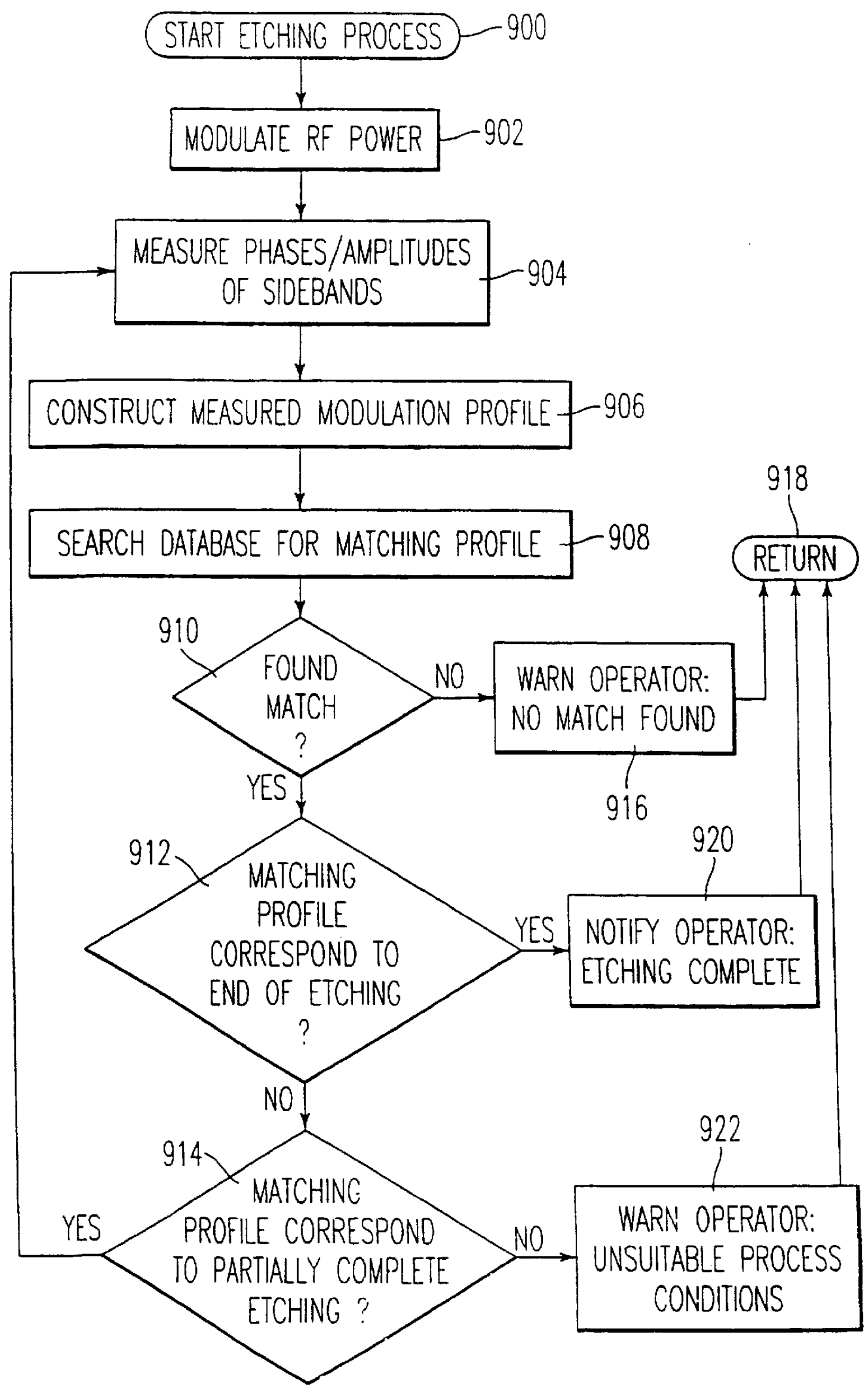
FIG. 9B is an example of a flowchart of a procedure used to determine current process conditions of a plasma process, based on modulation profiles stored in a database.

The procedure for monitoring the above exemplary process using profiling is illustrated in the flowchart of FIG. 9B. First, the etching process is started (step 900) and the RF power is modulated (step 902). Then, in step 904, the monitor/controller measures the phases and amplitudes of the sidebands so as to construct a measured modulation profile in step 906. At this point, in step 908, the monitor/controller searches the database for a modulation profile that matches the measured modulation profile. If a match is found (step 910), the procedure continues to step 912. If no match is found, the procedure continues to step 916 at which time a warning signal is produced or, alternatively, the sensed profile can either be matched with the stored profile it most nearly resembles or an interpolation operation can be performed. In step 912, the monitor/controller checks to see if the matching profile corresponds to the end of the etching step. If so, the procedure continues to step 920. If the matching profile does not correspond to expected conditions for the end of etching, the procedure continues to step 914. In step 914, the monitor/controller checks to ensure that the matching profile corresponds to acceptable process conditions for partially completed etching. If so, the procedure returns to step 904 and repeats the measurement sequence. If not, the procedure continues to step 922.

In steps 916, 920, and 922, important information is given to the operator (or the central process controller 20 at FIG. 1), whereupon the procedure of FIG. 9B is terminated. Step 916 warns the operator that no acceptable matching profile has been found in the database, indicating that the process is in an unknown state. Step 920 notifies the operator that the etching is complete. Step 922 warns the operator that, although the process is in a known state, it is not in a suitable state. It should also be noted that, while this procedure represents an exemplary method of monitoring the process conditions, variations thereof are possible as should be readily apparent to those skilled in the art.

According to another aspect of the invention, the earlier described procedure (illustrated in FIG. 10) of accumulating the data which characterizes the system is automated. This procedure can be performed, e.g., during development of the system (i.e., before a production model is produced), during production of the system (i.e., before the system is shipped to end-users), or after production if the monitor/controller is to be provided on a retrofit basis. In either case the monitor/controller, as shipped or retrofit, contains the entire database. This feature is advantageous in that, aside from providing added convenience to the end-user, it is also beneficial for quality assurance, since the manufacturer has greater control over the data collection and characterization procedure. By avoiding the need for on-site characterization, the manufacturer can insure that only highly experienced, qualified personnel perform the characterization procedure. As a result, the chance of operator error is reduced, and the consistency and repeatability of the process is improved. This aspect can become particularly advantageous in preventing damage to expensive semiconductor wafers or equipment components.

According to an optional aspect of the invention, data can be interpolated between modulation profiles of the database to obtain further detailed information regarding the process/system conditions during a processing run. The neural network system performs interpolation automatically based on the weights between neurons. Using profiling, an interpolation method is used as described below. During a processing run, the aforementioned modulated RF power is supplied to the inputs of the plasma coupling elements of the system. A modulation profile of the current state of the process is obtained by measuring the above-described sideband components. To determine the current state of the process, the array of data determined from the measured sideband components (i.e., the measured modulation profile) is first compared to the stored profiles kept in the database. The stored profile that most closely matches the measured profile is used as an approximation of the measured modulation profile. Since each profile in the database is associated with a specific process state, also kept in the database, the actual process state can be determined or approximated. However, the profile measured during a processing run can fall between two more profiles stored in the database. In these cases, interpolation can be used to more accurately determine the conditions (i.e., state) of the process. After determining or approximating the process state, the monitor/controller considers the process states corresponding to adjacent values of the parameters in the database. The adjacent process states are then used to more accurately determine the actual process state.

According to one example, if the measured modulation profile corresponds to a given etching rate in an etching system, and this etching rate falls directly between the stored modulation profiles corresponding to the two nearest etching rates in the database, a weighted average is taken of the two nearest data points, and an accurate determination of the actual etching rate can be made. According to another example, if a first stored modulation profile corresponds to an etching process before the completion of the etching, and a second stored modulation profile corresponds to the same etching process after completion of the etching, then an intermediate modulation profile, between the first and second stored modulation profiles, can correspond to the moment when the etching step is complete or nearly complete. This intermediate modulation profile can be calculated from the first and second stored modulation profiles, using the interpolation procedure. By monitoring the measured modulation profile and determining when it matches the aforementioned intermediate modulation profile, the moment of completion of the etching step can be accurately determined. The interpolation feature provides the advantage that, during characterization of the system, the process conditions tested are not required to be extremely close together. Gaps in the data can be "filled in" by either interpolation procedure. This allows the characterization procedure to be performed more quickly and allows the system to accommodate measured profiles which are not identical to stored profiles.

In addition to detecting the completion of a processing step, the monitor/controller may be configured so that it can adjust the phase, amplitude, or frequency of the RF power supplied to the respective plasma coupling elements. If the system has been characterized well enough, information can be obtained as to what effect will result from changing the characteristics of the power applied to a given plasma coupling element. If the monitor/controller, by determining the modulation profile during a run, determines that the conditions of the process are unsuitable, it is possible to tune the phase, amplitude, or frequency of the power applied to one or more plasma coupling elements in order to compensate for this discrepancy. The phase of the RF power can be adjusted by tuning the variable components in the matching networks. The amplitude and frequency can be tuned by sending a command to a control circuit in the RF source. By utilizing these techniques, better consistency/repeatability of the process is obtained. For example, a system which has processed a number of substrates since the last cleaning/maintenance operation can be operated to produce the same results as a system which has just undergone cleaning/maintenance.

The advantage of being able to controllably adjust the plasma state, and therefore the process state, may be more readily appreciated with reference to the following examples. According to a first example, a series of test runs has (1) fully characterized an etching process or (2) trained a neural network to control/predict the etching process. During a production run of this process, the monitor/controller determines that, based on measurements of the modulation profile, the current process state does not match the desired process state, and the amount of power received by one of the plasma coupling elements is too low. As a result, the monitor/controller infers that the etching is proceeding too slowly. The monitor/controller further determines that, based on (1) information in the database or (2) weights in the neural network, respectively, an increase in the power supplied from one of the RF sources will increase the etching rate. The monitor/controller therefore increases the amplitude of the power supplied by the appropriate RF source, thereby compensating for the slow etching rate. Alternatively, the monitor/controller may determine that the etching rate can be increased by tuning the phase of the RF power being received by one of the plasma coupling elements. In this case, the monitor/controller tunes the appropriate matching network so as to provide the necessary phase shift, thereby correcting the problem. As should be readily apparent, the technique of monitoring the modulation response signals and compensating for any discrepancies provides vastly improved control and repeatability of the process and, therefore, improves the consistency of the resulting product.

A second example relates to an etching process which nominally uses a gas mixture of, e.g., 30% HCl and 70% Ar. The etching process of the second example has been fully characterized by a series of test runs under a variety of different conditions, including a variety of different gas mixtures ranging, e.g., from 15% HCl to 50% HCl. During a production run of this process, the monitor/controller determines that, based on the measured modulation response signals/modulation profile, the gas mixture of the current process state contains only 20% HCl. As a result, the monitor/controller infers that the etching rate is too low, and compensates for this by increasing the power supplied from one of the RF sources. Alternatively, the flow of HCl gas can be increased.

The above examples address the effects of insufficient power and incorrect gas mixture. However, the monitor/controller is capable of compensating for discrepancies in a variety of different process parameters, such as, but not limited to, gas pressure, system cleanliness, and RF matching. Although the monitor/controller in the above examples corrected problems in the process by adjusting the RF power produced by one of the RF sources, other parameters could also be adjusted including, but not limited to, flow rate of a particular gas in the mixture (adjusted by sending a signal to a gas flow controller) and gas pressure (adjusted by sending a signal to one or more gas flow controllers or by sending a signal to an adjustable valve on an outlet port of the chamber), depending upon empirical determinations.

As should be readily apparent from the foregoing, in accordance with the present invention, detailed data relating to the plasma state and system conditions can be obtained. During the performance of a process, the data is utilized to monitor the conditions and/or progress of the process, or to detect problems. Precise monitoring of the conditions/progress of the process allows the system to manufacture a more consistent/reliable product. In addition, the early detection of problems allows maintenance to be performed promptly to prevent wafers/substrate from being processed in an improperly functioning system. This also contributes to better quality assurance.

According to another aspect of the invention, it has been recognized that a monitor/controller display can be advantageously utilized to provide a human operator with a variety of different data. Examples of data which can be displayed include values or conditions of maintenance, of tunable elements in the matching networks, amplitudes or phases of the harmonics or sidebands measured at the respective plasma coupling elements, relative phases (differences in phases) of two or more harmonics or sidebands, amplitudes or phases of signals between the harmonics, relative phases of two or more signals between the harmonics, magnitudes or phases of the input impedances of the respective matching networks, light emission at various wavelengths observed coming from the plasma, or graphs of any of these variables as a function of time. These graphs can be displayed in "real-time" (i.e., as time progresses), or they can be displayed in "event-time". Event-time is a mode of operation in which a particular event triggers the system to take a sample of data. This event may be an arcing incident, the end of a process step, or another user defined event. Other parameters which can be monitored and displayed, depending on the particular process being observed, include the amount of power demanded by the central process controller to be sent into the respective plasma coupling elements, the amount of power actually measured at the respective plasma coupling elements or their respective matching networks, the ratios of various harmonics or of various segments of the broad band frequency spectrum (i.e., frequency bins), the ratio of the amplitude of a measured harmonic at one node compared to the amplitude of a measured harmonic at another node, or broad band signal power in a section of the frequency spectrum measured at one node compared to signal power in the same section of the frequency spectrum measured at a different node.

Figures 6A, 6B:
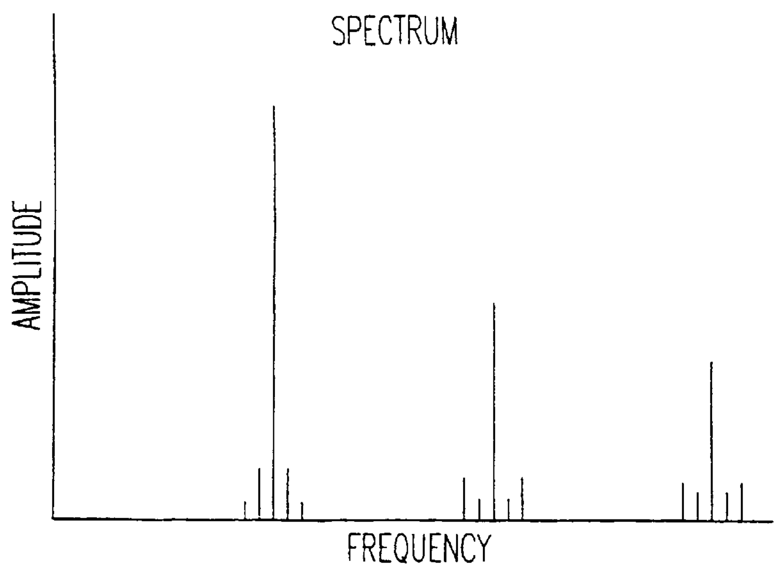
FIG. 6A is a first screen display.
FIG. 6B is a second screen display.

In a preferred embodiment of the invention, a graph of the spectrum of the signal from a node of the power delivery circuit, including the fundamental, harmonics, and side-bands can be displayed, as illustrated in FIG. 6A. The information can be retrieved at a rate specified by the user (query mode), at a rate specified by the controller (push mode), or using a combination of the two modes. Further, some types of information (e.g., error information) can be specified as always in push mode so as to bring it to an operator's attention as soon as possible. In query mode, a self-refreshing WWW browser or ActiveX control can be used to periodically collect data in a standard format and display the data. According to another arrangement, illustrated in FIG. 6B, a chart of ratios of the magnitudes of various harmonics can be displayed in text format. Alternatively, the display may combine the views of FIGS. 6A and 6B, or even further views, in a split screen format (e.g., by using frames in a WWW browser). Furthermore, the views of FIGS. 6A and 6B, or other views, may be sequentially alternated in time. It is to be understood that these display arrangements are examples, and a variety of other display formats can be utilized.

The above-described method of displaying data provides the operator with a clearer understanding of the state of the process, so that the operator is better able to monitor or control the system and detect problems before they become damaging, or if damage has already occurred, its effects can be minimized. As a result, improved product consistency is obtained, and damage to the system is avoided, thereby reducing maintenance costs.

As should be readily apparent from the foregoing, the various aspects and features of the present invention offer several advantages over those of conventional systems. For example, by providing a detailed and accurate determination of the state/conditions of a process, improved control of the process is achieved. In addition, by thoroughly monitoring the process, and displaying important data, potentially damaging problems can be addressed before the damage occurs or so that the damage is minimized. As a result, improved quality control/assurance and yield, and reduced maintenance costs can be achieved.

Recently, experimental results taken from a plasma etch chamber have indicated that harmonic content in electrical signals taken from plasma coupling elements is a viable diagnostic (or control variable) for impedance matching networks. The investigated plasma etch chamber includes two independent RF inputs with respective impedance matching networks. The first RF input inductively couples RF energy to a plasma via a helical coil, and the second RF input provides an RF bias (and DC self-bias) to a substrate via a substrate holding chuck.

Figure 11A:
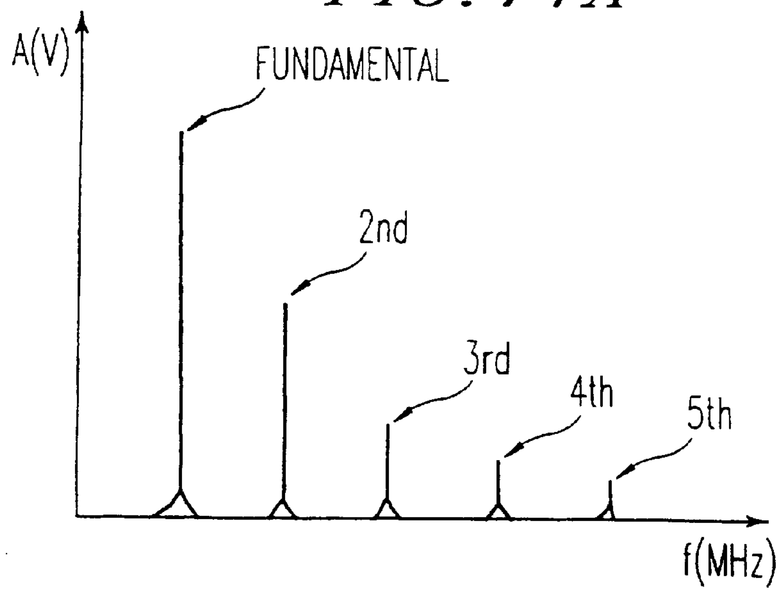
FIG. 11A is a graph showing the first five harmonics in the frequency spectrum taken from voltage measurements sampled at the primary conductor of a plasma system, after removing noise.
Figure 11B:
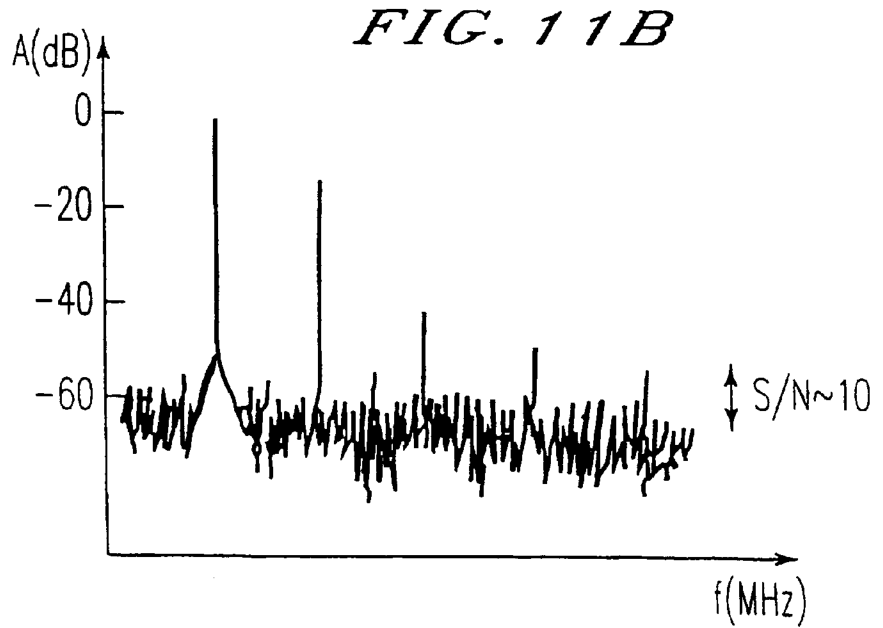
FIG. 11B is a graph showing the spectrum of FIG. 11A, but before removing the noise.

Measurements of the voltage were taken on the primary conductor carrying RF power from the impedance matching network to the base of the chuck using a Tektronix high voltage probe. The voltage was sampled at 200 MHZ for 15 RF periods of a 13.56 MHZ input. The sampling frequency is sufficient to resolve beyond the fifth harmonic. FIGS. 11A and 11B illustrate a typical Fourier transform (frequency spectrum) of a voltage time trace in which the fundamental drive frequency, as well as the second through fifth harmonics are readily identifiable. In FIG. 11A the noise has been removed for clarity. In FIG. 11B, the original signal, including noise, is illustrated. Clearly, the harmonic amplitude decays with increasing harmonic number; however, even the fifth harmonic has a signal-to-noise (S/N) ratio of at least ten. For a given set of conditions existing within the process chamber, a unique set of harmonic ratios can be recorded whereby the harmonic ratios are defined as the harmonic amplitudes at each harmonic frequency normalized by the amplitude of the fundamental (first) drive frequency (i.e., 13.56 MHZ in the example). The measurement of the ratio of harmonic amplitudes on the chuck was determined to be very repeatable (between conditions, chamber maintenance, etc.) and the error in the measurements was determined to be less than 5 to 10% for the second harmonic and less than 2.5% for the odd harmonics.

Figure 12A:
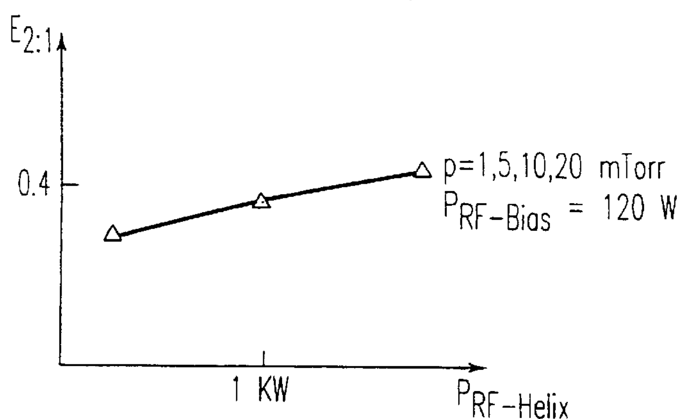
FIGS. 12A–12C are graphs of harmonic amplitude ratios for the second harmonic when several process parameters are varied.
Figure 12B:
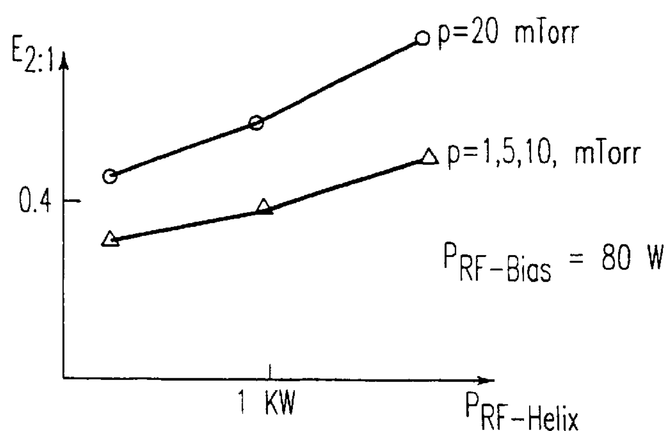
Figure 12C:
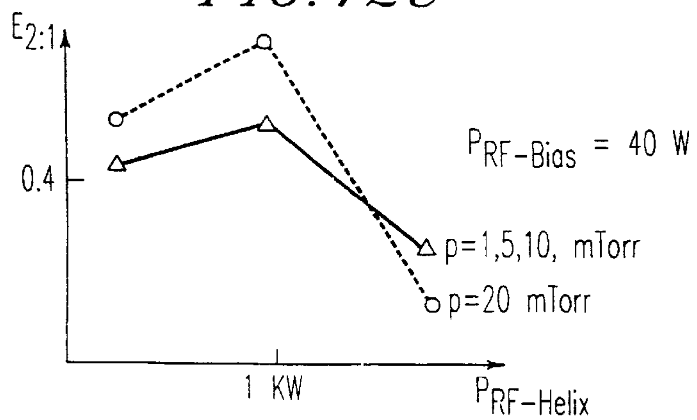

It has been determined that monitoring the harmonic amplitude ratios on the chuck using a high voltage probe can enable the user and/or a feedback controller to tune an impedance matching network for the RF chuck bias to maximize transmitted power and minimize reflected power. FIGS. 12A–13D illustrate harmonic amplitude ratios over a three-dimensional parameter space, wherein the chamber pressure, RF source power input to the helical coil, and the RF bias power input to the chuck are varied. A harmonic amplitude ratio $E_{n:1}$ has been defined as the ratio of the amplitude of the nth harmonic frequency to the amplitude of the fundamental frequency. For example, FIGS. 12A–12C illustrate the variation of the ratio $E_{2:1}$ (i.e., for the second harmonic) as a function of the RF source power at three different RF bias power inputs, i.e., 120 W, 80 W and 40 W, respectively, with chamber pressures ranging from 1 to 20 mTorr. FIG. 12A shows that at high (120 W) RF bias power, the sensitivity of measurements to the chamber pressure is negligible or within the error limits (in particular for $_{E2:1}$). However, as the RF bias power is reduced (as in FIGS. 12B and 12C), a pressure dependence is observable. In particular, a chamber pressure of 20 mTorr causes noticeable change as compared to 10 m Torr. This may be due to greater collisional effects associated with the reduced mean free path at 20 m Torr, which is an order of magnitude greater than the mean free path at 1 mTorr, and the mean free path's scale relative to the plasma sheath. In addition, except at low RF bias power (40 W), there is little dependence of $E_{2:1}$ on the RF bias power. Therefore, a series of measurements (from prior chamber characterization) can determine the RF source power input to the helix based upon $E_{2:1}$.

Figure 13A:
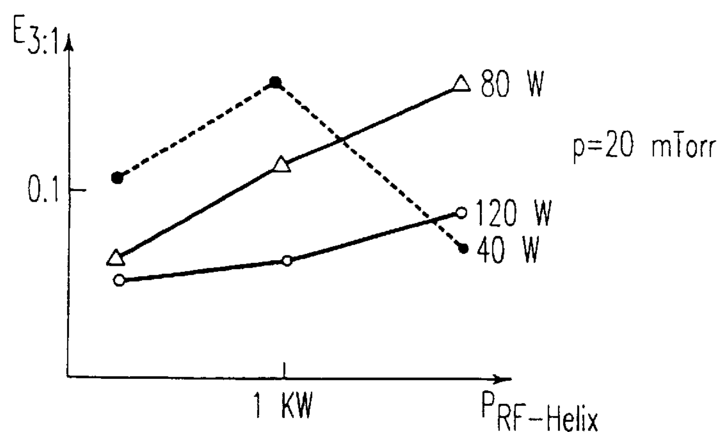
FIGS. 13A–13D are graphs of harmonic amplitude ratios for the third harmonic when several process parameters are varied.
Figure 13B:
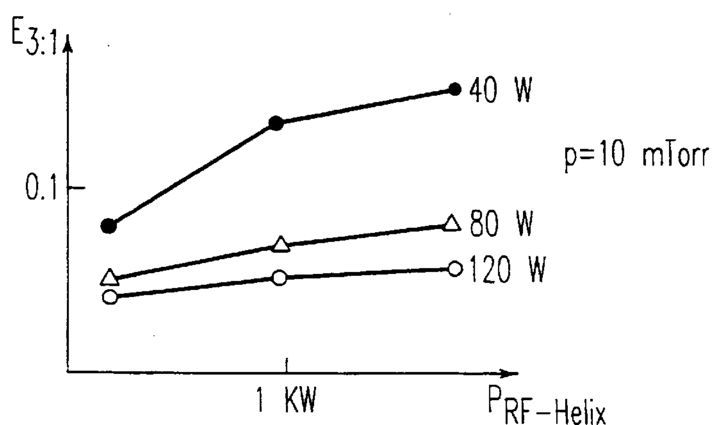
Figure 13C:
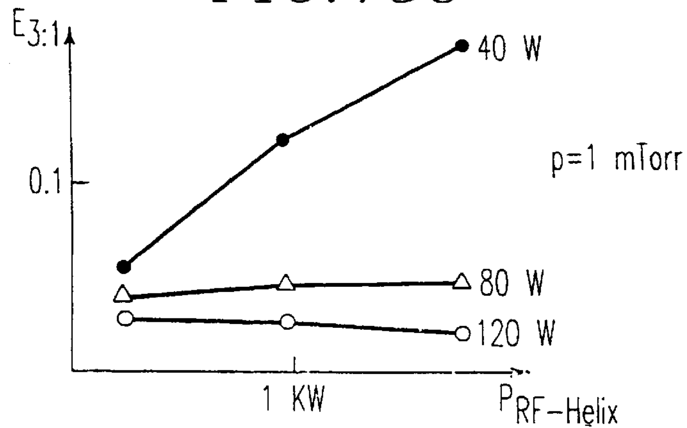
Figure 13D:
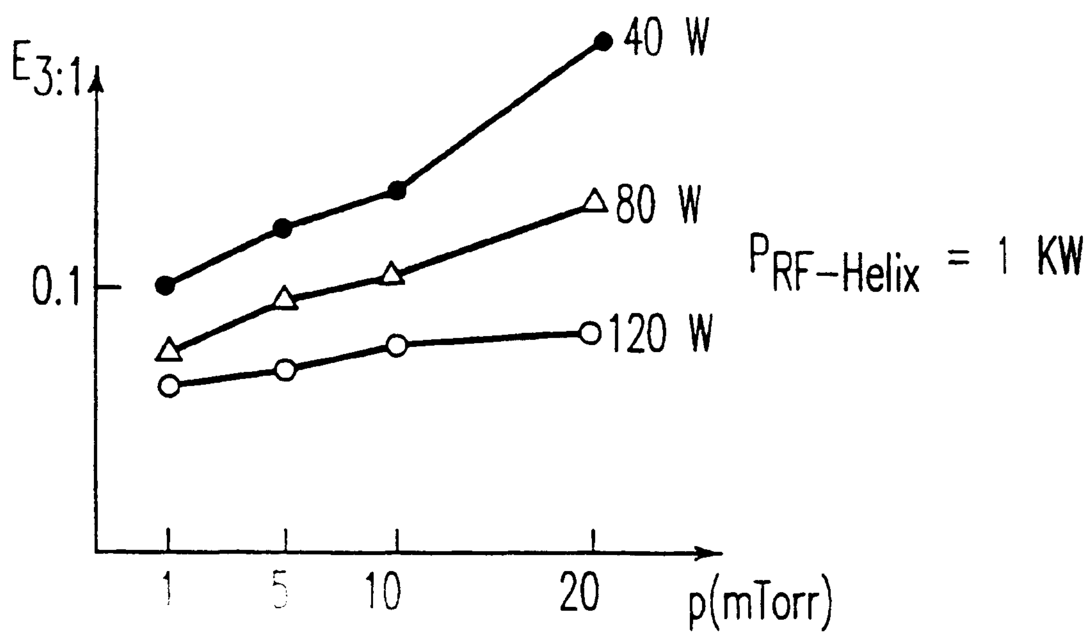

FIGS. 13A–13C illustrate measurements for the third harmonic, i.e., $E_{3:1}$. Clearly, the third harmonic is sensitive to the chamber pressure. FIG. 13D illustrates the harmonic amplitude ratio $E_{3:1}$ as a function of the pressure for a RF source power of 1 kW, and at three RF bias power inputs (40 W, 80 W and 120 W, respectively). Clearly, a well-behaved dependence of $E_{3:1}$ to the pressure an RF bias power is observed. Therefore, using the information of FIGS. 12A–12C, the RF source power input from $E_{2:1}$ can be determined, as can the chamber pressure and RF bias power input from FIG. 13D. However, additional data relationships allow dissociating of the input parameters based upon the harmonic content observed. For example, differences in harmonic amplitude ratios were assessed and determined to perform well in identifying chamber conditions. In fact, there is nothing limiting the size of the parameter space, except that the complexity of the correlation becomes exceedingly difficult. Specifically, the three-dimensional space tends to push the bounds to which the data can be analyzed. At this point, one requires an intelligent control system comprising a computer and detection devices that incorporates either a predetermined database of chamber characteristics or a neural network.

In summary, it has been shown that there exists a direct correlation between the condition of the plasma and the ratio of harmonic amplitudes on the substrate holding chuck. Moreover, it has been shown that, for a given system, a subset of harmonic information can be used to dissociate between each plasma process input, e.g., pressure, RF input power to the source and RF input power to the chuck. Hence, the harmonic signature can identify the process inputs and the plasma condition described by these conditions. The subset of harmonic information can be composed of any harmonic amplitude ratio, linear combination of harmonic amplitude ratios, and/or non-linear combination of harmonic amplitude ratios. More importantly, the harmonic signature on a plasma coupling element, or combination of elements, can be used to correlate with physical parameters that directly affect the process, i.e., ion energy, ion energy distribution, plasma density, chemical species, etc. When referring to a combination of plasma coupling elements, the use of harmonic amplitudes and their ratios to the amplitude of the fundamental frequency is not limited to the chuck but can be applicable to a variety of electrical plasma coupling elements, e.g., helical coil, bias shield, etc.

Obviously, numerous modifications and variations of the present invention are possible in light of the above teachings. It is therefore to be understood that within the scope of the appended claims, the invention may be practiced otherwise than as specifically described herein.

What is claimed is:

1. A plasma system comprising:

a power source;

a first plasma coupling element for providing power from said power source to a plasma;

a power varying controller for modulating at least one of an amplitude, a frequency, and a phase of said power to produce a modulation profile; and a monitoring sensor for receiving said modulation profile of said first plasma coupling element, wherein said modulation profile is caused by said power varying controller.

2. The system as claimed in claim 1, wherein said monitoring sensor comprises a frequency sensor for measuring a first detected characteristic of a first component of said modulation profile at a first frequency and a second detected characteristic of a second component of said modulation profile at a second frequency;

said system further comprising:

a memory for storing stored data, said stored data including a first stored characteristic and a second stored characteristic, wherein said first stored characteristic corresponds to said first predetermined frequency and said second stored characteristic corresponds to said second predetermined frequency; and a central processing unit which compares at least one of said first detected characteristic and said second detected characteristic to at least one of said first stored characteristic and said second stored characteristic, wherein said first detected characteristic, said first stored characteristic, said second detected characteristic and said second stored characteristic are each at least one of an amplitude and a phase.

3. The system as claimed in claim 1, further comprising a visual display for displaying at least one of:

an amplitude of a component of said modulation profile;

a phase of a component of said modulation profile;

a ratio of (1) a first amplitude of a first component of said modulation profile and (2) a second amplitude of said second component of modulation profile; and a relative phase of a first component of said modulation profile with respect to a second component of said modulation profile, said relative phase being a difference of (1) a phase of said first component and (2) a phase of said second component.

4. The system as claimed in claim 1, wherein said monitoring sensor comprises a frequency sensor for measuring, at a detection time, a first detected characteristic of a first component of said modulation profile at a first predetermined frequency;

said system further comprising:

a memory for storing stored data, said stored data including first and second stored characteristics corresponding to said first predetermined frequency; and a central processing unit which compares said first detected characteristic to said first and second stored characteristics, wherein all of said first detected characteristic and said first and second stored characteristics are at least one of an amplitude and a phase, wherein said first and second stored characteristics corresponds to first and second conditions of a process parameter of said plasma process, respectively, and wherein said process parameter is at least one of:

progress of the process;

ion density of the plasma;

gas mixture of the plasma;

gas pressure of the plasma;

proper assembly of an electrical component coupled to the plasma;

cleanliness of the chamber;

thickness of a coating on a surface within the chamber; and quality of matching of a plasma coupling element to the power source.

5. The system as claimed in claim 1, wherein said plasma coupling element comprises at least one of:

an electrode;

an inductive coil;

a bias shield; and an electrostatic chuck.

6. The system as claimed in claim 2, wherein said modulation profile includes a sideband component caused by said power varying controller, said sideband component occurring at a frequency corresponding to at least one of:

(a) a sideband frequency of a fundamental frequency of said power source; and (b) a sideband frequency of a harmonic frequency of said fundamental frequency.

7. The system as claimed in claim 3, wherein said modulation profile includes a sideband component caused by said power varying controller, said sideband component occurring at a frequency corresponding to at least one of:

(a) a sideband frequency of a fundamental frequency of said power source; and (b) a sideband frequency of a harmonic frequency of said fundamental frequency.

8. The system as claimed in claim 4, wherein said modulation profile includes a sideband component caused by said power varying controller, said sideband component occurring at a frequency corresponding to at least one of:

(a) a sideband frequency of a fundamental frequency of said power source; and (b) a sideband frequency of a harmonic frequency of said fundamental frequency.

9. The system as claimed in claim 1, further comprising a second plasma coupling element coupled to said plasma.

10. The system as claimed in claim 9, wherein said modulation profile includes a sideband component caused by said power varying controller, said sideband component occurring at a frequency corresponding to at least one of:

(a) a sideband frequency of a fundamental frequency of said power source; and (b) a sideband frequency of a harmonic frequency of said fundamental frequency.

11. A method of controlling a plasma system, the method comprising the steps of:

providing a power source;

providing a plasma coupling element;

providing power from said power source to a plasma;

modulating at least one of an amplitude, a frequency, and a phase of said power in order to produce a modulation profile of said plasma coupling element; and receiving said modulation profile.

12. The method as claimed in claim 11, further comprising the steps of:

measuring a first detected characteristic of a first component of said modulation profile at a first frequency;

measuring a second detected characteristic of a second component of said modulation profile at a second frequency;

storing stored data, said stored data including a first stored characteristic and a second stored characteristic, wherein said first stored characteristic corresponds to said first frequency and said second stored characteristic corresponds to said second frequency; and comparing at least one of said first detected characteristic and said second detected characteristic to at least one of said first stored characteristic and said second stored characteristic, wherein said first and second detected characteristics and said first and second stored characteristics are at least one of an amplitude and a phase.

13. The method as claimed in claim 11, further comprising the steps of displaying at least one of:

an amplitude of a component of said modulation profile;

a phase of a component of said modulation profile;

a ratio of (1) a first amplitude of a first component of said modulation profile and (2) a second amplitude of a second component of said modulation profile; and a relative phase of a first component of said modulation profile with respect to a second component of said modulation profile, said relative phase being a difference of (1) a phase of said first component and (2) a phase of said second component.

14. The method as claimed in claim 11, further comprising the steps of:

processing a first substrate;

measuring a first detected characteristic of a component of said modulation profile at a frequency corresponding to a first value of a process parameter, and wherein said process parameter is at least one of:

(1) progress of a process;

(2) ion density of the plasma;

(3) mixture of the plasma;

(4) gas pressure of the plasma;

(5) proper assembly of an electrical component coupled to the plasma;

(6) cleanliness of the chamber;

(7) thickness of a coating on a surface within the chamber; and (8) quality of matching of a plasma coupling element to the power source;

storing said first detected characteristic;

processing a second substrate;

measuring a second detected characteristic of a component of said modulation profile at said frequency corresponding to a second value of said process parameter;

storing said second detected characteristic;

processing a third substrate;

measuring a third detected characteristic of said modulation profile at said frequency; and comparing said third detected characteristic to said first and second detected characteristics in order to analyze said modulation profile for said third substrate, wherein said first, second and third detected characteristics are at least one of an amplitude and a phase.

15. The method as claimed in claim 12, wherein said step of varying comprises modulating at least one of an amplitude, a frequency, and a phase of said power in order to provide a sideband component of said modulation profile of said plasma coupling element, wherein said sideband component is at a frequency corresponding to at least one of: (a) a sideband frequency of a fundamental frequency of said power source; and (b) a sideband frequency of a harmonic frequency of a fundamental frequency of said power source.

16. The method as claimed in claim 14, wherein said step of varying comprises modulating at least one of an amplitude, a frequency, and a phase of said power in order to provide a sideband component of said modulation profile of said plasma coupling element, wherein said sideband component is at a frequency corresponding to at least one of: (a) a sideband frequency of a fundamental frequency of said power source; and (b) a sideband frequency of a harmonic frequency of a fundamental frequency of said power source.

17. A plasma system comprising:

a power source;

a first plasma coupling element for providing power from said power source to a plasma;

a power varying controller for modulating at least one of an amplitude, a frequency, and a phase of said power to produce a modulation profile; and a monitoring sensor for receiving the modulation profile, wherein the modulation profile includes a sideband component caused by the modulation at a frequency corresponding to at least one of:

(a) a sideband frequency of a fundamental frequency of said power source; and (b) a sideband frequency of a harmonic frequency of said fundamental frequency.

18. In a method of controlling a power source for a plasma coupling element of a plasma system, the improvement comprising:

modulating at least one of an amplitude, a frequency, and a phase of power delivered by a power source to a plasma coupling element in order to produce a modulation profile;

receiving said modulation profile; and controlling said power source based on said modulation profile, wherein said modulation profile includes a sideband component caused by the modulation, at a frequency corresponding to at least one of: (a) a sideband frequency of a fundamental frequency of said power source; and (b) a sideband frequency of a harmonic frequency of a fundamental frequency of said power source.

* * * * *

UNITED STATES PATENT AND TRADEMARK OFFICE

CERTIFICATE OF CORRECTION

PATENT NO. : 6,535,785 B2
DATED : March 18, 2003
INVENTOR(S) : Johnson et al.

It is certified that error appears in the above-identified patent and that said Letters Patent is hereby corrected as shown below:

Title page,
Items [63] and [60], Related U.S. Application Data, should read as follows:

-- Related U.S. Application Data

[63] Continuation of application No. 09/508,105, filed as application No. PCT/US98/18498 on Sep. 17, 1998, now Pat. No. 6,351,683.
[60] Provisional application No. 60/059,151, filed on Sep. 17. 1997. --

Signed and Sealed this

Fifth Day of August, 2003

JAMES E. ROGAN
*Director of the United States Patent and Trademark Office*